US 6,720,711 B2

(12) United States Patent
Iino et al.

(10) Patent No.: US 6,720,711 B2
(45) Date of Patent: Apr. 13, 2004

(54) PIEZOELECTRIC ACTUATOR, ULTRASONIC MOTOR EQUIPPED WITH PIEZOELECTRIC ACTUATOR, AND ELECTRONIC APPARATUS EQUIPPED WITH PIEZOELECTRIC ACTUATOR

(75) Inventors: Akihiro Iino, Chiba (JP); Masao Kasuga, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 09/398,639

(22) Filed: Sep. 17, 1999

(65) Prior Publication Data

US 2002/0089259 A1 Jul. 11, 2002

(30) Foreign Application Priority Data

Sep. 18, 1998 (JP) .......................... 10-265372
Sep. 14, 1999 (JP) .......................... 11-259853

(51) Int. Cl.$^7$ ............................. H01L 41/08
(52) U.S. Cl. ..................... 310/332; 310/323.04
(58) Field of Search ................... 310/332, 328, 310/323.02, 323.03, 323.04, 331

(56) References Cited

U.S. PATENT DOCUMENTS

| | | | | |
|---|---|---|---|---|
| 3,154,700 A | * | 10/1964 | McNaney | 310/328 |
| 4,562,373 A | | 12/1985 | Tokusima et al. | 310/328 |
| 4,633,120 A | * | 12/1986 | Sato et al. | 310/328 |
| 4,765,140 A | * | 8/1988 | Imoto et al. | 310/328 |
| 4,814,659 A | * | 3/1989 | Sawada | 310/323.17 |
| 4,882,498 A | * | 11/1989 | Cochran et al. | 250/559.04 |
| 4,965,482 A | | 10/1990 | Ohnishi et al. | 310/323 |
| 5,089,708 A | * | 2/1992 | Asselbergs | 250/307 |
| 5,168,189 A | * | 12/1992 | Dam et al. | 310/328 |
| 5,182,484 A | * | 1/1993 | Culp | 310/328 |
| 5,233,256 A | * | 8/1993 | Hayashi et al. | 310/317 |
| 5,281,899 A | * | 1/1994 | Culp | 310/316.01 |
| 5,378,948 A | * | 1/1995 | Richter | 310/328 |
| 5,381,171 A | * | 1/1995 | Hosono et al. | 310/328 |
| 5,834,879 A | * | 11/1998 | Watanabe et al. | 310/328 |
| 5,969,464 A | * | 10/1999 | Nakano et al. | 310/328 |
| 6,006,595 A | * | 12/1999 | Kitamura | 73/105 |
| 6,066,911 A | * | 5/2000 | Lindemann et al. | 310/328 |
| 6,147,434 A | * | 11/2000 | Nakano et al. | 310/317 |
| 6,211,606 B1 | * | 4/2001 | Kanada et al. | 310/328 |
| 6,278,223 B1 | * | 8/2001 | Sasaki et al. | 310/328 |
| 6,452,312 B1 | * | 9/2002 | Hanaki et al. | 310/328 |

FOREIGN PATENT DOCUMENTS

| | | |
|---|---|---|
| DE | 3142684 | 5/1983 |
| EP | 0 247 540 | * 12/1987 |
| EP | 0262637 | 4/1988 |
| EP | 0294102 | 12/1988 |
| EP | 0584775 | 3/1994 |
| EP | 0784349 | 7/1997 |
| JP | 09-289342 | * 11/1997 |

OTHER PUBLICATIONS

Patent Abstracts of Japan, vol. 1998, No. 03, Feb. 27, 1998.
EPO publication No. 09289342 and publication date Nov. 4, 1997.

* cited by examiner

*Primary Examiner*—Mark Budd
(74) *Attorney, Agent, or Firm*—Adams & Wilks

(57) ABSTRACT

A piezoelectric actuator comprises a plurality of piezoelectric elements stacked in a thickness direction thereof for undergoing expansion/contraction movement to vibrationally drive the piezoelectric actuator in accordance with a driving signal applied to the piezoelectric elements. Each of the piezoelectric elements has a length extending in a direction generally perpendicular to the stacking direction. The length of each of at least two of the piezoelectric elements being different from the length of at least one other of the piezoelectric elements.

8 Claims, 13 Drawing Sheets

PIEZOELECTRIC ACTUATOR, ULTRASONIC MOTOR EQUIPPED WITH PIEZOELECTRIC ACTUATOR, AND ELECTRONIC APPARATUS EQUIPPED WITH PIEZOELECTRIC ACTUATOR

BACKGROUND OF THE INVENTION

1. Field of the Invention

The present invention relates to piezoelectric actuators represented by ultrasonic motors and bimorph type actuators used in clocks, cameras, printers, storage devices and the like and, more particularly, to a piezoelectric actuator whose output is improved from that available in the prior art.

2. Description of the Related Art

Piezoelectric actuators that utilize a vibration of a piezoelectric element in response to the application of a driving signal such as an AC voltage as a motive force to move a movable body are attracting attention especially in the field of micromechanics because of their high electromechanical energy conversion efficiency.

A description will now be made which references to FIGS. 13A, 13B and 13C on a piezoelectric actuator 100 which is an example of conventional piezoelectric actuators.

The configuration of the piezoelectric actuator 100 will now be described.

As shown in FIG. 13A, the piezoelectric actuator 100 is substantially comprised of a rectangular elastic plate 101 made of metal, a piezoelectric element 102 integrally stacked on one of the surfaces of the elastic plate 101 and a piezoelectric element 103 formed on the other surface of the elastic plate 101.

The piezoelectric elements 102 and 103 are polarized in the direction of the thickness thereof. Referring to the polarizing direction, for example, surfaces 102*a* and 103*a* in contact with the elastic plate 101 are polarized to be negative and positive respectively, whereas surfaces 102*b* and 103*b* opposite thereto are polarized to be positive and negative respectively. That is, the piezoelectric elements 102 and 103 are polarized in opposite directions.

An electrode is provided on each of the surfaces 102*b* and 103*b* to substantially cover the entire surface. The elastic plate 101 serves as an electrode for the surfaces 102*a* and 103*a*.

An operation of the piezoelectric actuator 100 will now be described.

As shown in FIG. 13A, a voltage is first applied with the electrodes on the surfaces 102*b* and 103*b* serving as the negative pole and the elastic plate 101 serving as the positive pole.

The piezoelectric element 102 expands in the longitudinal direction because the voltage is applied in the direction opposite to the polarizing direction of the surfaces 102*b* and 102*a*.

The piezoelectric element 103 contracts in the longitudinal direction because the voltage is applied in the same direction as the polarizing direction of the surfaces 103*a* and 102*b*.

As a result, the piezoelectric actuator 100 is bent in the direction indicated by the arrow X in FIG. 13B, which generates a driving force to move the movable body (not shown) in the bending direction.

When a voltage is applied with the surfaces 102*b* and 103*b* as the positive pole and the surfaces 102*a* and 103*a* as the negative pole, the piezoelectric actuator 100 is bent in the direction opposite to the arrow X, which generates a driving force to move the movable body in the direction opposite to the direction shown in FIG. 13B.

However, upper limits have existed for the output and displacement of the piezoelectric actuator 100 because it is formed by simply forming one each piezoelectric element 102, 103 on both sides of the elastic plate 101 integrally.

As a technique to improve the piezoelectric actuator 100, a piezoelectric actuator 110 as shown in FIG. 13C has been provided in which piezoelectric elements 104 and 105 identical in configuration to the piezoelectric elements 102 and 103 are formed on the piezoelectric elements 102 and 103, respectively. However, increases in output or displacement was smaller than expected from the magnitude of the voltage, i.e., electric power input thereto. The output or displacement of the piezoelectric actuator 110 could be smaller than the output of the piezoelectric actuator 100 depending on the conditions.

The inventors identified a cause for the above-mentioned problem with the piezoelectric actuator 110 as follows. The same piezoelectric element as the piezoelectric element 102 is used as the piezoelectric element 104, which results in the same amount of expansion in spite of the fact that the expansion of the piezoelectric element 104 must be greater than the expansion of the piezoelectric element 102 because it is located further than the elastic plate 101 having a distortion-neutral plane. The same piezoelectric element as the piezoelectric element 103 is used as the piezoelectric element 105, which results in the same amount of contraction in spite of the fact that the contraction of the piezoelectric element 105 must be greater than the contraction of the piezoelectric element 103 because it is located further than the elastic plate 101.

That is, the piezoelectric element 104 has hindered the expansion of the piezoelectric element 102, and the piezoelectric element 105 has hindered the contraction of the piezoelectric element 103.

The invention has been conceived based on the above-described idea, and it is an object of the invention to provide a piezoelectric actuator which transmits a driving force of a plurality piezoelectric elements to the outside without loss.

SUMMARY OF THE INVENTION

In order to solve the above problem, according to one aspect of the invention, there is provided a piezoelectric actuator which is distorted according to an input driving signal to generate a driving force, characterized in that it is formed by integrally stacking a plurality of piezoelectric elements such that they do not hinder the operation of each other.

In the above-described aspect of the invention, for example, the piezoelectric actuator is a bimorph type actuator or an ultrasonic motor.

There is no limitation on the material of the piezoelectric elements.

Further, the thickness of each of the plurality of piezoelectric elements is appropriately adjusted in accordance with the operation and position of the piezoelectric element. Basically, a piezoelectric element is made thinner, the greater the distortion it must undergo. All of the plurality of piezoelectric elements may be different in thickness and, alternatively, some of them may have the same thickness.

In this aspect of the invention, by adjusting the thickness of the piezoelectric elements depending on the operations and positions of the piezoelectric elements, all of the piezoelectric elements contribute to the operation of the piezoelectric actuator without interfering with each other. It is therefore possible to fabricate a piezoelectric actuator which provides output greater than that available in the prior art with the same power consumption, which can be made smaller in size than that in the prior art having the same output and which consumes less power.

According to the invention, there is provided a piezoelectric actuator as described above, characterized in that the thickness of piezoelectric elements located on the side of the actuator with smaller distortion is larger than the thickness of piezoelectric elements located on the side thereof with greater distortion.

In this aspect of the invention, the thickness of each piezoelectric element is smaller, the further the piezoelectric element from a distortion-neutral plane of the actuator. Therefore, all of the piezoelectric elements contribute to the operation of the piezoelectric actuator without interfering with each other. It is therefore possible to fabricate a piezoelectric actuator which provides output greater than that available in the prior art with the same power consumption, which can be made smaller in size than that in the prior art having the same output and which consumes less power.

According to the invention, there is provided a piezoelectric actuator as described above, characterized in that at least two of the plurality of piezoelectric elements undergo identical vibrations.

All of the plurality of piezoelectric elements may undergo identical vibrations.

When the piezoelectric actuator is an ultrasonic motor, for example, the identical vibrations may be longitudinal vibrations, bending vibrations or torsional vibrations.

In this aspect of the invention, since at least part of the plurality of piezoelectric elements undergo identical vibrations, the vibrations are greater in magnitude than those in the prior art. It is therefore possible to fabricate a piezoelectric actuator which provides output greater than that available in the prior art with the same power consumption, which can be made smaller in size than that in the prior art having the same output and which consumes less power.

According to the invention, there is provided a piezoelectric actuator as described above, characterized in that the plurality of piezoelectric elements are stacked in a direction in parallel with a driving force extracting portion of the piezoelectric actuator.

In this aspect of the invention, the same effect as that described above is achieved.

According to the invention, there is provided a piezoelectric actuator as described above, characterized in that it is an ultrasonic motor which utilizes a composite vibration resulting from two different kinds of vibrations generated at the piezoelectric elements as a driving force and in that the two different kinds of vibrations are excited by separate piezoelectric elements.

The two different kinds of vibrations are, for example, a torsional vibration and an expansion vibration, although not limited to them.

Further, there are normally a plurality of piezoelectric elements for exciting each kind of vibration, and the thickness of them is adjusted such that each vibration does not interfere with the vibration, i.e., distortion of other piezoelectric elements.

In this aspect of the invention, in addition to the effect as described above, the adjustment of the thicknesses of the plurality of piezoelectric elements makes it possible to optimize the ratio of the magnitudes of the two different kinds of vibrations.

According to the invention, there is provided a piezoelectric actuator as described above, characterized in that it includes a piezoelectric element for detecting vibrations and in that the piezoelectric element for detecting vibrations is different in thickness from the other piezoelectric elements. Since driving piezoelectric elements are provided in a region which is greatly distorted, the detecting capability is higher, the smaller the thickness of the detecting piezoelectric element which is provided in a region having smaller distortion is.

In this aspect of the invention, the piezoelectric element for detection vibrations does not hinder the distortion of piezoelectric elements used as a source of a driving force and has higher detecting capability. This improves the accuracy of control over a piezoelectric actuator.

According to the invention, there is provided a piezoelectric actuator as described above, characterized in that it is an ultrasonic motor in which the thickness of the plurality of piezoelectric elements is equal to the thickness of a vibrating element integrally stacked on the plurality of piezoelectric elements.

In this aspect of the invention, since a driving force generated at the plurality of piezoelectric elements is transmitted to the vibrating element with highest efficiency, it is possible to fabricate an ultrasonic motor which provides output greater than that available in the prior art with the same power consumption, which can be made smaller in size than that in the prior art having the same output and which consumes less power.

According to the invention, there is provided an electronic apparatus having a piezoelectric actuator as described above.

For example, the electronic apparatus is an electronic clock, measuring apparatus, camera, printer, machine tool, robot, transfer apparatus, storage apparatus or the like.

In this aspect of the invention, an ultrasonic motor as described above is used which provides greater output with low power compared to conventional ultrasonic motors. Since this makes it possible to make an ultrasonic motor compact, an electronic apparatus with an ultrasonic motor can be provided which is compact and consumes less power.

BRIEF DESCRIPTION OF THE DRAWINGS

FIGS. 7A through 4D are schematic views illustrating a configuration of an ultrasonic motor 7 which is a fifth embodiment of the invention.

DETAILED DESCRIPTION OF PREFERRED EMBODIMENTS

Preferred embodiments of the invention will now be described in detail with reference to FIGS. 1 through 12.

Figure 1:
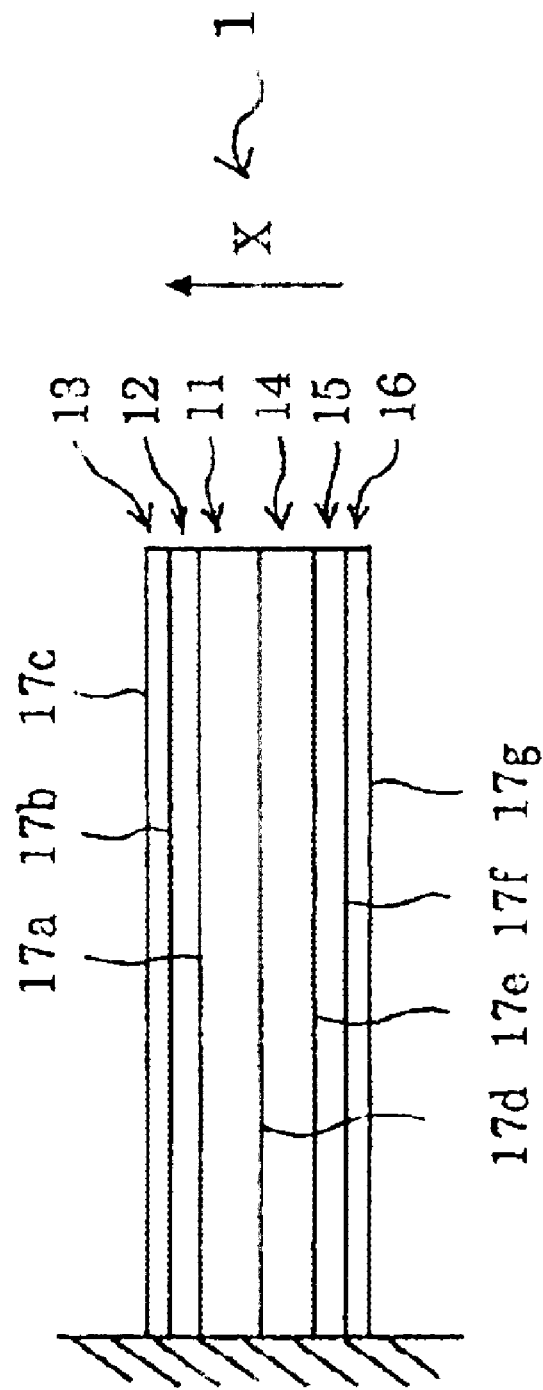
FIG. 1 is a sectional view showing a configuration of a piezoelectric actuator 1 which is a first embodiment of the invention.

FIG. 1 is a sectional view showing a configuration of a piezoelectric actuator 1 which is a first embodiment of the invention.

First, the configuration of the piezoelectric actuator 1 will be described.

The piezoelectric actuator 1 is substantially comprised of a rectangular piezoelectric element 11, a rectangular piezoelectric element 12 integrally stacked on the top surface of the piezoelectric element 11, a rectangular piezoelectric element 13 integrally stacked on the top surface of the piezoelectric element 12, a rectangular piezoelectric element 14 integrally stacked on the bottom surface of the piezoelectric element 11, a rectangular piezoelectric element 15 integrally stacked on the bottom surface of the piezoelectric element 14 and a rectangular piezoelectric element 16 integrally formed on the bottom surface of the piezoelectric element 15. One of the ends of the piezoelectric actuator 1 is a fixed end and the other is a free end.

An electrode 17a is provided at the interface between the piezoelectric elements 11 and 12. An electrode 17b is provided at the interface between the piezoelectric elements 12 and 13. An electrode 17c is provided on surface of the piezoelectric element 13 opposing the electrode 17b. An electrode 17d is provided at the interface (a distortion-neutral plane) between the piezoelectric elements 11 and 14. An electrode 17e is provided at the interface between the piezoelectric elements 14 and 15. An electrode 17f is provided at the interface between the piezoelectric elements 15 and 16. An electrode 17g is provided on surface of the piezoelectric element 15 opposing the electrode 17b. The electrodes are provided so as to cover the respective surfaces excluding the peripheral regions.

The electrodes 17a, 17c, 17e and 17g are in conduction to each other, and the electrodes 17b, 17d and 17f are in conduction to each other.

For example, the piezoelectric element 11 is made of barium titanate and is polarized in the stacking direction to provide the positive polarity on the surface thereof in contact with the electrode 17a and the negative polarity on the surface thereof in contact with the electrode 17d.

The piezoelectric element 12 is made of the same material as that of the piezoelectric element 11, identical to the piezoelectric element 11 in the configuration of the stacking surface and is thinner than the piezoelectric element 11. It is polarized in the stacking direction to provide the positive polarity on the surface thereof in contact with the electrode 17a and the negative polarity on the surface thereof in contact with the electrode 17b.

The piezoelectric element 13 is made of the same material as that of the piezoelectric element 11, identical to the piezoelectric element 12 in the configuration of the stacking surface and is thinner than the piezoelectric element 12. It is polarized in the stacking direction to provide negative polarity on the surface thereof in contact with the electrode 17b and the positive polarity on the surface thereof in contact with the electrode 17c.

The piezoelectric element 14 has the substantially same configuration as that of the piezoelectric element 11 and is made of the same material as that of the piezoelectric element 11. It is polarized in the stacking direction to provide the positive polarity on the surface thereof in contact with the electrode 17d and the negative polarity on the surface thereof in contact with the electrode 17e.

The piezoelectric element 15 has the substantially same configuration as that of the piezoelectric element 12 and is made of the same material as that of the piezoelectric element 11. It is polarized in the stacking direction to provide the negative polarity on the surface thereof in contact with the electrode 17e and the positive polarity on the surface thereof in contact with the electrode 17f.

The piezoelectric element 16 has the substantially same configuration as that of the piezoelectric element 13 and is made of the same material as that of the piezoelectric element 11. It is polarized in the stacking direction to provide the positive polarity on the surface thereof in contact with the electrode 17f and the negative polarity on the surface thereof in contact with the electrode 17g.

An operation of the piezoelectric actuator 1 will now be described.

The discussion will refer to a case in which a voltage is applied to the piezoelectric actuator 1 with the electrodes 17a, 17c, 17e and 17g serving as the positive pole and the electrodes 17b, 17d and 17f serving as the negative pole.

The piezoelectric element 11 contracts in the longitudinal direction because the surface thereof having the positive polarity is in contact with the electrode 17a, i.e., the positive pole and the surface thereof having the negative polarity is in contact with the electrode 17d, i.e., the negative pole.

Similarly, the piezoelectric element 12 contracts in the longitudinal direction because the surface thereof having the positive polarity is in contact with the electrode 17a, i.e., the positive pole and the surface thereof having the negative polarity is in contact with the electrode 17b, i.e., the negative pole.

The piezoelectric element 12 contracts more than the piezoelectric element 11 in spite of the fact that it is applied with the same voltage as that of the piezoelectric element 11, because it is thinner than the piezoelectric element 11.

Similarly, the piezoelectric element 13 contracts in the longitudinal direction because the surface thereof having the negative polarity is in contact with the electrode 17b, i.e., the negative pole and the surface thereof having the positive polarity is in contact with the electrode 17c, i.e., the positive pole.

The piezoelectric element 13 contracts more than the piezoelectric element 12 in spite of the fact that it is applied with the same voltage as that of the piezoelectric element 12 because it is thinner than the piezoelectric element 12.

The piezoelectric element 14 expands in the longitudinal direction because the surface thereof having the positive polarity is in contact with the electrode 17d, i.e., the negative pole and the surface thereof having the negative polarity is in contact with the electrode 17e, i.e., the positive pole.

Similarly, the piezoelectric element 15 expands in the longitudinal direction because the surface thereof having the positive polarity is in contact with the electrode 17e, i.e., the negative pole and the surface thereof having the negative polarity is in contact with the electrode 17f, i.e., the positive pole.

The piezoelectric element 15 expands more than the piezoelectric element 14 in spite of the fact that it is applied with the same voltage as that of the piezoelectric element 14 because it is thinner than the piezoelectric element 14.

Similarly, the piezoelectric element 16 expands in the longitudinal direction because the surface thereof having the negative polarity is in contact with the electrode 17f, i.e., the positive pole and the surface thereof having the positive polarity is in contact with the electrode 17g, i.e., the negative pole.

The piezoelectric element 16 expands more than the piezoelectric element 15 in spite of the fact that it is applied with the same voltage as that of the piezoelectric element 15 because it is thinner than the piezoelectric element 15.

As a result, the piezoelectric elements 11, 12 and 13 of the piezoelectric actuator 1 contract, and the piezoelectric elements 14, 15 and 16 expand with the electrode 17d being a distortion neutral plane. This results in a driving force in the direction of the arrow X shown in FIG. 1. Among the piezoelectric elements 11, 12 and 13, the piezoelectric element 13 located furthest from the electrode 17d which is a distortion-neutral plane undergoes the greatest contraction, and the piezoelectric element 11 located directly above the electrode 17d undergoes the smallest contraction. As a result, the piezoelectric element 12 does not interfere with the contraction of the piezoelectric element 11 and thus increases the driving force of the piezoelectric actuator 1, and the piezoelectric element 13 does not interfere with the contraction of the piezoelectric elements 11 and 12 and thus increases the driving force of the piezoelectric actuator 1.

Similarly, among the piezoelectric elements 14, 15 and 16, the piezoelectric element 16 located furthest from the electrode 17d undergoes the greatest expansion, and the piezoelectric element 14 located directly under the electrode 17d undergoes the smallest expansion. As a result, the piezoelectric element 15 does not interfere with the expansion of the piezoelectric element 14 and thus increases the driving force of the piezoelectric actuator 1, and the piezoelectric element 16 does not interfere with the expansion of the piezoelectric elements 14 and 15 and thus increases the driving force and displacement of the piezoelectric actuator 1.

When a voltage is applied to the piezoelectric actuator 1 with the electrodes 17a, 17c, 17e and 17g conversely serving as the negative pole and the electrodes 17b, 17d and 17f conversely serving as the positive pole, the piezoelectric elements 11, 12 and 13 expand and the piezoelectric elements 14, 15 and 16 contract with the electrode 17d being a distortion-neutral plane. This results in a driving force in the direction opposite to the arrow X.

Among the piezoelectric elements 11, 12 and 13, the piezoelectric element 13 located furthest from the electrode 17d undergoes the greatest expansion, and the piezoelectric element 11 located directly above the electrode 17d undergoes the smallest expansion. As a result, the piezoelectric element 12 does not interfere with the expansion of the piezoelectric element 11 and thus increases the driving force of the piezoelectric actuator 1, and the piezoelectric element 13 does not interfere with the expansion of the piezoelectric elements 11 and 12 and thus increases the driving force and displacement of the piezoelectric actuator 1.

Similarly, among the piezoelectric elements 14, 15 and 16, the piezoelectric element 16 located furthest from the electrode 17d undergoes the greatest contraction, and the piezoelectric element 14 located directly under the electrode 17d undergoes the smallest contraction. As a result, the piezoelectric element 15 does not interfere with the contraction of the piezoelectric element 14 and thus increases the driving force of the piezoelectric actuator 1, and the piezoelectric element 16 does not interfere with the contraction of the piezoelectric elements 14 and 15 and thus increases the driving force of the piezoelectric actuator 1.

As described above, in the piezoelectric actuator 1 which is an embodiment of the invention, integrally stacked on the top side of the piezoelectric element 11 are the piezoelectric element 12 which is thinner than the piezoelectric element 11 and which expands and contracts in the same direction as that of the piezoelectric element 11 at the same voltage and the piezoelectric element 13 which is thinner than the piezoelectric element 12 and which expands and contracts in the same direction as that of the piezoelectric element 11 at the same voltage. Integrally stacked on the bottom side of the piezoelectric element 11 are the piezoelectric element 14 which expands and contracts oppositely to the piezoelectric element 11 in direction at the same voltage, the piezoelectric element 15 which is thinner than the piezoelectric element 14 and which expands and contracts in the same direction as that of the piezoelectric element 14 at the same voltage and the piezoelectric element 16 which is thinner than the piezoelectric element 15 and which expands and contracts in the same direction as the piezoelectric element 14 at the same voltage. Therefore, the expansion and contraction of each of the piezoelectric elements 11, 12, 13, 14, 15 and 16 contributes to the driving force without interfering with the expansion and contraction of other piezoelectric elements.

Therefore, the piezoelectric actuator 1 has a simple structure and has higher output and efficiency than that available in the prior art, so that its size and power consumption can be smaller compared to those of conventional devices having the same output.

Any modification may be made on the present embodiment as long as it does not depart from the principle of the invention.

For example, any piezoelectric material may be used for the piezoelectric elements 11 through 16.

The optimum ratio between the thicknesses of the piezoelectric elements 11 through 16 is not uniquely determined, and it is rather determined by a plurality of factors such as the electromechanical coupling coefficient of the piezoelectric material and the surface area of the stacking surfaces of the piezoelectric elements 11 through 16.

The polarizing direction of each of the piezoelectric elements and the structure of the electrodes are not limited to the present embodiment, and any modification is possible as long as they undergo expansion and contraction in the respective same directions which are separated at the distortion-neutral plane.

It is not necessary to stack the same number of piezoelectric elements on both sides of the neutral plane as long as a plurality of piezoelectric elements are provided on each side. Especially, when the number of stacked layers is three or more, it is not necessary that all of the piezoelectric elements are different in thickness, and the same effect can be achieved even if some of them have the same thickness. For example, the reverse of the above-described effect can be achieved by attaching a weight to the free end, to provide an acceleration sensor or force sensor that outputs signals with a great magnitude.

Figure 2:
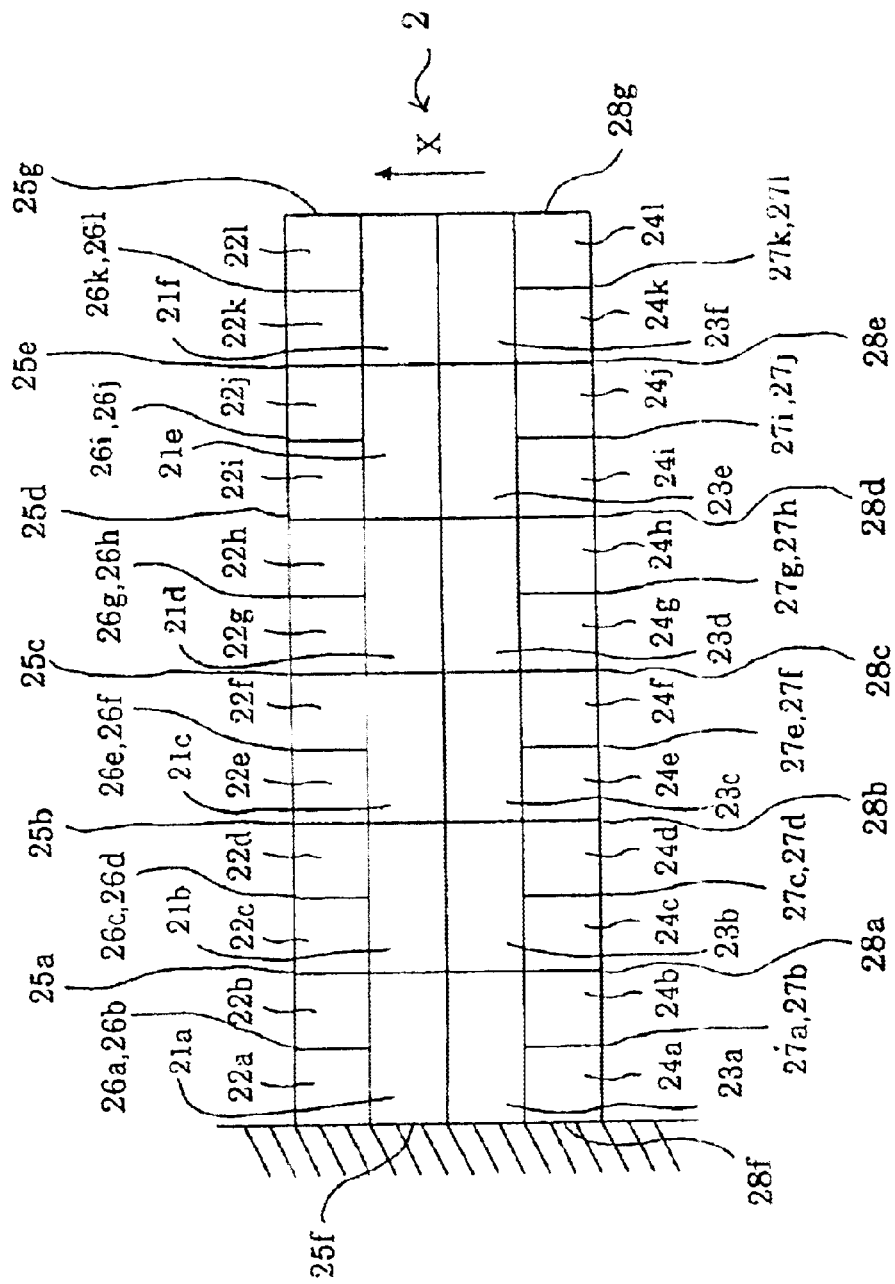
FIG. 2 is a sectional view showing a configuration of a piezoelectric actuator 2 which is a second embodiment of the invention.

FIG. 2 is a sectional view showing a configuration of a piezoelectric actuator 2 which is a second embodiment of the invention.

The configuration of the piezoelectric actuator 2 will now be described.

The piezoelectric actuator 2 is substantially comprised of a first group of six rectangular piezoelectric elements 21a, 21b, 21c, 21d, 21e and 21f integrally arranged in the longitudinal direction to form one rectangular element, a second group of twelve rectangular piezoelectric elements 22a, 22b, 22c, 22d, 22e, 22f, 22g, 22h, 22i, 22j, 22k and 22l integrally stacked on the top surfaces of the six piezoelectric elements 21a through 21f having a length in the longitudinal direction which is one half of that of the piezoelectric elements 21a through 21f, a third group of six piezoelectric elements 23a, 23b, 12c, 23d, 23e and 23f having the same configuration as the piezoelectric elements 21a through 21f integrally stacked on the bottom surfaces of the piezoelectric elements 21a through 21f, and a fourth group of twelve rectangular piezoelectric elements 24a, 24b, 24c, 24d, 24e, 24f, 24g, 24h, 24i, 24j, 24k and 24l having the same configuration as the piezoelectric elements 22a through 22l integrally stacked on the bottom surfaces of the six piezoelectric elements 23a through 23f. One end of the element is a fixed end, and the other is a free end.

In addition, the bottom surfaces of the piezoelectric elements 21a through 21f act as a distortion-neutral plane in the context of the present invention.

For example, the piezoelectric elements 21a through 21f, 22a through 22l, 23a through 23f and 24a through 24l are made of barium titanate or lead zirconate titanate and are polarized in the longitudinal direction. The piezoelectric elements have the same thickness in the stacking direction.

The piezoelectric elements 21a, 21c and 21e are polarized to have the positive polarity at the fixed end and the negative polarity at the free end. The piezoelectric elements 21b, 21d and 21f are polarized to have the negative polarity at the fixed end and the positive polarity at the free end.

The piezoelectric elements 22a, 22b, 22e, 22f, 22i and 22j are polarized to have the positive polarity at the fixed end and the negative polarity at the free end. The piezoelectric elements 22c, 22d, 22g, 22h, 22k and 22l are polarized to have the negative polarity at the fixed end and the positive polarity at the free end.

The piezoelectric elements 23a, 23c and 23e are polarized to have the negative polarity at the fixed end and the positive polarity at the free end. The piezoelectric elements 23b, 23d and 23f are polarized to have the positive polarity at the fixed end and the negative polarity at the free end.

The piezoelectric elements 24a, 24b, 24e, 24f, 24i and 24j are polarized to have the negative polarity at the fixed end and the positive polarity at the free end. The piezoelectric elements 24c, 24d, 24g, 24h, 24k and 24l are polarized to have the positive polarity at the fixed end and the negative polarity at the free end.

Further, at the interfaces between the adjoining piezoelectric elements 21a through 21f, electrodes 25a, 25b, 25c, 25d and 25e (listed in the order of closeness to the fixed end) are sequentially provided such that they extend to substantially cover the entity of respective interfaces between the piezoelectric elements 22a through 22l, piezoelectric elements 23a through 23f and piezoelectric elements 24a through 24l.

Electrodes 25f and 25g are provided to substantially cover the entirety of the fixed end faces of the piezoelectric elements 21a, 22a, 23a and 24a and the free end faces 21f, 22l, 23f and 24l, respectively.

Electrodes 26a, 26c, 26e, 26g, 26i and 26k are respectively provided on the sides of the piezoelectric elements 22a, 22c, 22e, 22g, 22i and 22k toward the free end. Electrodes 26b, 26d, 26f, 26h, 26j and 26l are respectively provided on the sides of the piezoelectric elements 22b, 22d, 22f, 22h, 22j and 22l toward the fixed end.

Electrodes 27a, 27c, 27e, 27g, 27i and 27k are respectively provided on the sides of the piezoelectric elements 24a, 24c, 24e, 24g, 24i and 24k toward the free end. Electrodes 27b, 27d, 27f, 27h, 27j and 27l are respectively provided on the sides of the piezoelectric elements 24b, 24d, 24f, 24h, 24j and 24l toward the fixed end.

The electrodes 25a, 25c, 25e, 26a, 26d, 26e, 26h, 26i, 26l, 27a, 27d, 27e, 27h, 27i and 27l are in conduction to each other, and the electrodes 25b, 25d, 25f, 25g, 26b, 26c, 26f, 26g, 26j, 26k, 27b, 27c, 27f, 27g, 27j and 27k are in conduction to each other.

An operation of the piezoelectric actuator 2 will now be described.

The discussion will refer to a case in which a voltage is applied to the piezoelectric actuator 2 with the electrodes 25a, 25c, 25e, 26a, 26d, 26e, 26h, 26i, 26l, 27a, 27d, 27e, 27h, 27i and 27l serving as the negative pole and the electrodes 25b, 25d, 25f, 25g, 26b, 26c, 26f, 26g, 26j, 26k, 27b, 27c, 27f, 27g, 27j and 27k serving as the positive pole.

The piezoelectric elements 21a, 21b, 21c, 21d, 21e and 21f contract in the longitudinal direction because the positively polarized surfaces thereof are respectively in contact with the electrodes 25f, 25b, 25d and 25g, i.e., the positive poles and the negatively polarized surfaces thereof are respectively in contact with the electrodes 25a, 25c and 25e, i.e., the negative poles.

The piezoelectric elements 22a, 22b, 22c, 22d, 22e, 22f, 22g, 22h, 22i, 22j, 22k and 22l contract in the longitudinal direction because the positively polarized surfaces thereof are respectively in contact with the electrodes 25f, 26b, 26c, 25b, 25b, 26f, 26g, 25d, 25d. 26j, 26k, and 25g, i.e., the positive poles and the negatively polarized surfaces thereof are respectively in contact with the electrodes 26a, 25a, 25a, 26d, 26e, 25c, 25c, 26h, 26i, 25e, 25e and 26l, i.e., the negative poles.

Since the length of the piezoelectric elements 22a through 22l in the longitudinal direction, i.e., the direction in which the voltage is applied is one half of that of the piezoelectric elements 21a through 21f, they contract in an amount which is about twice the contraction of the piezoelectric elements 21a through 21f in spite of the fact that the same voltage is applied to them.

The piezoelectric elements 23a, 23b, 23c, 23d, 23e and 23f expand in the longitudinal direction because the positively polarized surfaces thereof are respectively in contact with the electrodes 28a, 28c and 28e, i.e., the negative poles and the negatively polarized surfaces thereof are respectively in contact with the electrodes 28f, 28b, 28d, 28g, i.e., the positive poles.

The piezoelectric elements 24a, 24b, 24c, 24d, 24e, 24f, 24g, 24h, 24i, 24j, 24k and 24l expand in the longitudinal direction because the positively polarized surfaces thereof are respectively in contact with the electrodes 27a, 28a, 28a, 27d, 27e, 28c, 28c, 27h, 27i, 28e, 28e and 27l, i.e., the negative poles and the negatively polarized surfaces thereof are respectively in contact with the electrodes 28f, 27b, 27c, 28b, 28b, 27f, 27g, 28d, 28d, 27j, 27k and 28g, i.e., the positive poles.

Since the length of the piezoelectric elements 24a through 24l in the longitudinal direction, i.e., the direction in which the voltage is applied is one half of that of the piezoelectric elements 23a through 23f, they expand in an amount which is about twice the expansion of the piezoelectric elements 23a through 23f in spite of the fact that the same voltage is applied to them.

As a result, the piezoelectric elements 21a through 21f and 22a through 22l of the piezoelectric actuator 2 contract with the bottom surfaces of the piezoelectric elements 21a through 21f being a distortion-neutral plane, and the piezoelectric elements 23a through 23f and 24a through 24l expand with the bottom surfaces of the piezoelectric elements 23a through 23f being a distortion-neutral plane. This results in a driving force in the direction of the arrow X shown in FIG. 2.

Since the piezoelectric elements 22a through 22l located further from the bottom surfaces of the piezoelectric elements 21a through 21f undergo contraction greater than the contraction of the piezoelectric elements 21a through 21f, the piezoelectric elements 22a through 22l do not interfere with the contraction of the piezoelectric elements 21a through 21f and thus increase the driving force and displacement of the piezoelectric actuator 2.

Similarly, since the piezoelectric elements 24a through 24l located further from the upper surfaces of the piezoelectric elements 23a through 23f undergo expansion greater than the expansion of the piezoelectric elements 23a through 23f, the piezoelectric elements 24a through 24l do not interfere with the expansion of the piezoelectric elements 23a through 23f and thus increase the driving force and displacement of the piezoelectric actuator 2.

When a voltage is applied to the piezoelectric actuator 2 with the electrodes 25a, 25c, 25e, 26a, 26d, 26e, 26h, 26i, 26l, 27a, 27d, 27e, 27h, 27i and 27l conversely serving as the positive pole and the electrodes 25b, 25d, 25f, 25g, 26b, 26c, 26f, 26g, 26j, 26k, 27b, 27c, 27f, 27g, 27j and 27k conversely serving as the negative pole, the piezoelectric elements 21a through 21f and 22a through 22l expand with the bottom surfaces of the piezoelectric elements 21a through 21f being as a distortion-neutral plane, and the piezoelectric elements 23a through 23f and 24a through 24l contract with the upper surfaces of the piezoelectric elements 23a through 23f being a distortion-neutral plane. This results in a driving force in the direction opposite to the arrow X.

Since the piezoelectric elements 22a through 22l located further from the bottom surfaces of the piezoelectric elements 21a through 21f undergo expansion greater than the expansion of the piezoelectric elements 21a through 21f, the piezoelectric elements 22a through 22l do not interfere with the expansion of the piezoelectric elements 21a through 21f and thus increase the driving force and displacement of the piezoelectric actuator 2.

Similarly, since the piezoelectric elements 24a through 24l located further from the bottom surfaces of the piezoelectric elements 23a through 23f undergo contraction greater than the contraction of the piezoelectric elements 23a through 23f, the piezoelectric elements 24a through 24l do not interfere with the contraction of the piezoelectric elements 23a through 23f and thus increase the driving force and displacement of the piezoelectric actuator 2.

As described above, on the top side of the six piezoelectric elements 21a through 21f integrally arranged in the longitudinal direction of the piezoelectric actuator 2 which is an embodiment of the invention, the twelve piezoelectric elements 22a through 22l are integrally stacked which are one half of the piezoelectric elements 21a through 21f in the longitudinal length and which expand and contract in the same direction as that of the piezoelectric elements 21a through 21f at the same voltage. Integrally stacked on the bottom side of the piezoelectric elements 21a through 21f are the six piezoelectric elements 23a through 23f which contract and expand oppositely to the piezoelectric elements 21a through 21f in direction at the same voltage and the twelve piezoelectric elements 24a through 24l which are one half of the piezoelectric elements 23a through 23f in the longitudinal length and which contract and expand in the same direction as that of the piezoelectric elements 23a through 23f at the same voltage. Therefore, the expansion and contraction of each of the piezoelectric elements 21a through 21f, 22a through 22l, 23a through 23f and 24a through 24l contributes to the driving force and displacement without interfering with the expansion and contraction of other piezoelectric elements.

Therefore, the piezoelectric actuator 2 has a simple structure and has higher output and efficiency than that available in the prior art, its size and power consumption can be smaller compared to those of conventional devices having the same output.

Any modification may be made on the present embodiment as long as it does not depart from the principle of the invention.

For example, any piezoelectric material may be used for the piezoelectric elements 21a through 21f, 22a through 22l, 23a through 23f and 24a through 24l.

It is not essential that the length of the piezoelectric elements 22a through 22l in the longitudinal direction is one half of the length of the piezoelectric elements 21a through 21f, and they are only required to be shorter than the piezoelectric elements 21a through 21f. It is not essential that all of the piezoelectric elements 21a through 21f have the same length and that all of the piezoelectric elements 22a through 22l have the same length.

Similarly, it is not essential that the length of the piezoelectric elements 24a through 24l in the longitudinal direction is one half of the length of the piezoelectric elements 23a through 23f, and they are only required to be shorter than the piezoelectric elements 23a through 23f. It is not essential that all of the piezoelectric elements 23a through 23f have the same length and that all of the piezoelectric elements 24a through 24l have the same length.

The optimum ratio between the length of the piezoelectric elements is not uniquely determined, and it is rather determined by a plurality of factors such as the electromechanical coupling coefficient of the piezoelectric material and the surface area of the stacking surface of each piezoelectric element.

It is not essential that all of the piezoelectric elements 21a through 21f, 22a through 22l, 23a through 23f and 24a through 24l have the same thickness, and the piezoelectric elements 22a through 22l and the piezoelectric elements 23a through 23f may be thinner than the piezoelectric elements 21a through 21f and the piezoelectric elements 24a through 24l, respectively.

The polarizing direction of each of the piezoelectric elements and the structure of the electrodes are not limited to the present embodiment, and any modification is possible as long as they undergo expansion and contraction in the respective same directions which are separated at the distortion-neutral plane.

It is not necessary to stack the same number of piezoelectric elements on both sides of the neutral plane as long as a plurality of piezoelectric elements are provided on each side. Especially, when the number of stacked layers is three or more, it is not necessary that the lengths of the piezoelectric elements in the longitudinal direction are all different depending of the stacking positions, and the same effect can be achieved even if some of them have the same thickness. For example, the reverse of the above-described effect can be achieved by attaching a weight to the free end to provide an acceleration sensor or force sensor that outputs signals with a great magnitude.

Figure 3A:
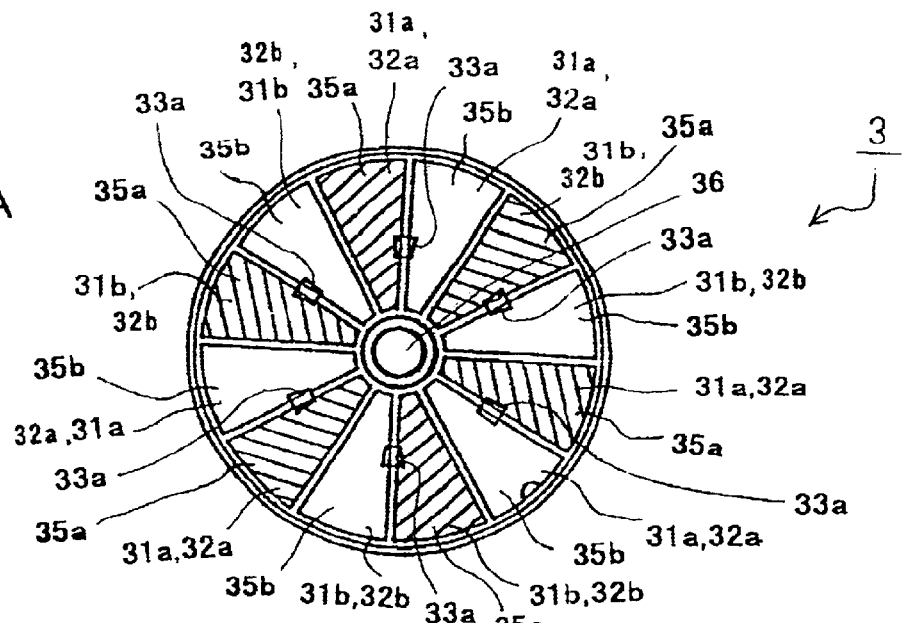
FIGS. 3A through 3D are schematic views illustrating a configuration and operation of a piezoelectric actuator 3 which is a third embodiment of the invention.
Figure 3B:
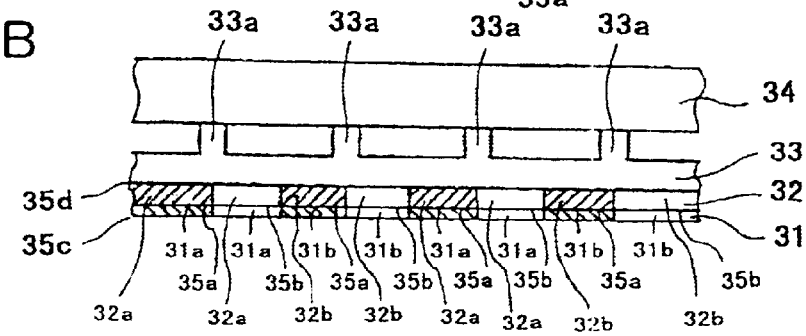
Figure 3C:
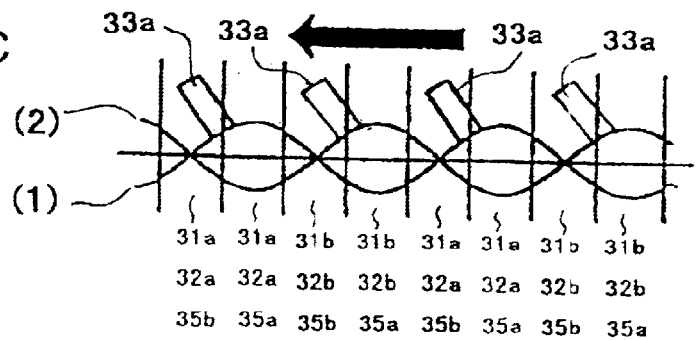

FIGS. 3A through 3D are schematic views showing a structure and operation of an ultrasonic motor 3 having a piezoelectric actuator according to a third embodiment of the invention. FIG. 3A is a schematic front view of the ultrasonic motor 3. FIG. 3B is a schematic view showing a stacking structure of the ultrasonic motor 3. FIG. 3C is a schematic view illustrating an operation of the ultrasonic motor 3.

The structure of the ultrasonic motor 3 will now be described.

As shown in FIG. 3B, the ultrasonic motor 3 is substantially comprised of a disc-shaped piezoelectric element 31, a disc-shaped piezoelectric element 32 integrally stacked on the piezoelectric element 31 and a vibrator 33 integrally stacked on the piezoelectric element 32, and a rotor 34 provided on the vibrator 33 in contact therewith is moved about a shaft 36.

That is, the ultrasonic motor 3 has a structure in which the piezoelectric element 31 thinner than the piezoelectric element 32 is integrally stacked on the bottom surface of the piezoelectric element 32 which corresponds to a piezoelectric element of a conventional rotary ultrasonic motor.

The sum of the thickness of the piezoelectric elements 31 and 32 is equal to the thickness of the vibrator 33. As a result, the interface between the piezoelectric element 32 and vibrator 33 acts as a distortion-neutral plane in the context of the present invention.

For example, the piezoelectric element 31 is made of barium titanate or lead zirconate titanate and has a structure formed by alternately providing six pairs of sector regions 31a, 31a adjacent to each other having a center angle of 30° and six pairs of sector regions 31b, 31b adjacent to each other having a center angle of 30°.

The regions 31a and 31b are polarized to have opposite polarities in the direction of the thickness thereof.

A hole is provided in the center of the piezoelectric element 31 to insert a shaft 36.

The piezoelectric element 32 is made of the same material as that of the piezoelectric element 31 and is fabricated to have the same diameter as that of the piezoelectric element 31 and to have a thickness greater than that of the piezoelectric element 31. It has a structure formed by alternately providing six pairs of sector regions 32a, 32a adjacent to each other having a center angle of 30° and six pairs of sector regions 32b, 32b adjacent to each other having a center angle of 30°.

All of the regions 32a and 31a overlap with the regions 32b and 31b, respectively.

The regions 32a and 32b are polarized oppositely to the regions 31a and 31b respectively in the direction of the thickness thereof.

A hole is provided in the center of the piezoelectric element 32 to insert the shaft 36.

Electrodes 35a and 35b in conduction to the regions 31a and 32a are alternately provided on substantially the entirety of the six interfaces between the regions 31a and 32a and the six interfaces between the regions 31b and 32b.

All of the six electrodes 35a are in conduction to each other, and all of the six electrodes 35b are in conduction to each other.

Further, an electrode 35c is provided to substantially cover the entire bottom surface of the piezoelectric element 31, and an electrode 35d is provided to substantially cover the entire top surface of the piezoelectric element 32. The electrodes 35c and 35d are grounded.

The vibrator 33 is a disc-shaped elastic element having the same diameter as those of the piezoelectric elements 31 and 32 and is formed with a hole for receiving the shaft 36 in the center thereof.

The vibrator 33 has six projections 33a in total which are in contact with the rotor 34 and which are provided in locations substantially corresponding to the centers of the boundaries between the adjoining regions 32a and locations substantially corresponding to the centers of the boundaries between the adjoining regions 32b.

An operation of the ultrasonic motor 3 will now be described.

First, let us assume that an AC voltage oscillating in a sinusoidal manner is input to the electrodes 35a of the ultrasonic motor 3 as a driving signal.

When the electrodes 35a have a negative potential, the three regions 31a and three regions 32a in contact with the electrodes 35a among six each regions 31a and 32a expand in the direction of the thickness because the negative potential is applied to the positively polarized surfaces of them. The regions 31a undergo expansion greater than the expansion of the regions 32a in spite of the fact that the same voltage is applied, because they are thinner than the regions 32a, and the expansion of the regions 32a is not therefore interfered.

The three regions 31b and three regions 32b in contact with the electrodes 35a among six each regions 31b and 32b contract in the direction of the thickness because the negative potential is applied to the negatively polarized surfaces of them. The regions 31b undergo contraction greater than the contraction of the regions 32b in spite of the fact that the same voltage is applied because they are thinner than the regions 32b, and the contraction of the regions 32b is not therefore interfered.

Therefore, when the potential of the electrodes 35a is increased in the negative direction, as indicated by (1) in FIG. 3C, an interaction between the expansion of the regions 31a and the expansion of the regions 32a causes the projections 33a provided between the regions 32a to incline in the direction of the arrow in FIG. 3C more than those in a conventional rotary ultrasonic motor to be urged against the rotor 34 more strongly than in the conventional rotary ultrasonic motor. As a result, the rotor 34 is moved in the direction of the arrow in FIG. 3C by a force greater than that in the conventional rotary ultrasonic motor.

When the electrodes 35a conversely have a positive potential, the three regions 31a and three regions 32a in contact with the electrodes 35a among six each regions 31a and 32a contract in the direction of the thickness, because the positive potential is applied to the positively polarized surfaces of them. The regions 31a undergo contraction greater than the contraction of the regions 32*a* in spite of the fact that the same voltage is applied, because they are thinner than the regions 32*a*, and the expansion of the regions 32*a* is not therefore interfered.

The three regions 31*b* and three regions 32*b* in contact with the electrodes 35*a* among six each regions 31*b* and 32*b* expand in the direction of the thickness because the positive potential is applied to the negatively polarized surfaces of them. The regions 31*b* undergo expansion greater than the expansion of the regions 32*b* in spite of the fact that the same voltage is applied, because they are thinner than the regions 32*b*, and the expansion of the regions 32*b* is not therefore interfered.

Therefore, when the potential of the electrodes 35*a* is increased in the positive direction, as indicated by (2) in FIG. 3C, an interaction between the expansion of the regions 31*b* and the expansion of the regions 32*b* causes the projections 33*a* provided between the regions 32*b* to incline in the direction of the arrow in FIG. 3C more than those in a conventional rotary ultrasonic motor to be urged against the rotor 34 more strongly than in the conventional rotary ultrasonic motor. As a result, the rotor 34 is moved in the direction of the arrow in FIG. 3C by a force greater than that in the conventional rotary ultrasonic motor.

The ultrasonic motor 3 thus causes the rotor 34 to be smoothly moved in the direction indicated by the arrow in FIG. 3C with a force greater than that in the conventional rotary ultrasonic motor.

Let us now assume that an AC voltage oscillating in a sinusoidal manner is conversely input to the electrodes 35*b* of the ultrasonic motor 3 as a driving signal.

When the electrodes 35*b* have a negative potential, the three regions 31*a* and three regions 32*a* in contact with the electrodes 35*b* among six each regions 31*a* and 32*a* expand in the direction of the thickness, because the negative potential is applied to the positively polarized surfaces of them. The regions 31*a* undergo expansion greater than the expansion of the regions 32*a* in spite of the fact that the same voltage is applied, because they are thinner than the regions 32*a*, and the expansion of the regions 32*a* is not therefore interfered.

The three regions 31*b* and three regions 32*b* in contact with the electrodes 35*b* among six each regions 31*b* and 32*b* contract in the direction of the thickness because the negative potential is applied to the negatively polarized surfaces of them. The regions 31*b* undergo contraction greater than the contraction of the regions 32*b* in spite of the fact that the same voltage is applied, because they are thinner than the regions 32*b*, and the contraction of the regions 32*b* is not therefore interfered.

Figure 3D:
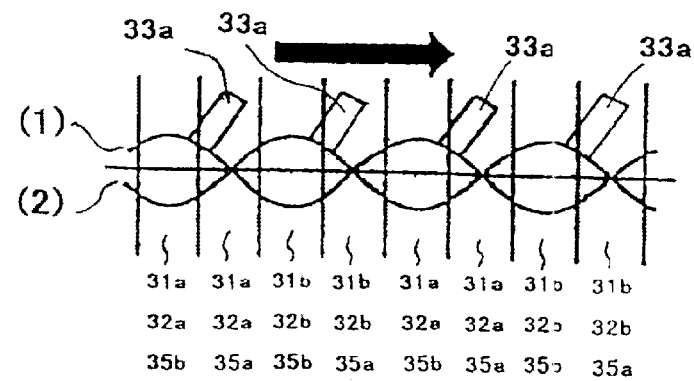

Therefore, when the potential of the electrodes 35*b* is increased in the negative direction, as indicated by (1) in FIG. 3D, an interaction between the expansion of the regions 31*a* and the expansion of the regions 32*a* causes the projections 33*a* provided between the regions 32*a* to incline in the direction of the arrow in FIG. 3D, i.e., in the direction opposite to the direction in FIG. 3C more than those in the conventional rotary ultrasonic motor to be urged against the rotor 34 more strongly than in the conventional rotary ultrasonic motor. As a result, the rotor 34 is moved in the direction of the arrow in FIG. 3D by a force greater than that in the conventional rotary ultrasonic motor.

When the electrodes 35*b* conversely have a positive potential, the three regions 31*a* and three regions 32*a* in contact with the electrodes 35*b* among six each regions 31*a* and 32*a* contract in the direction of the thickness, because the positive potential is applied to the positively polarized surfaces of them. The regions 31*a* undergo contraction greater than the contraction of the regions 32*a* in spite of the fact that the same voltage is applied, because they are thinner than the regions 32*a*, and the expansion of the regions 32*a* is not therefore interfered.

The three regions 31*b* and three regions 32*b* in contact with the electrodes 35*b* among six each regions 31*b* and 32*b* expand in the direction of the thickness, because the positive potential is applied to the negatively polarized surfaces of them. The regions 31*b* undergo expansion greater than the expansion of the regions 32*b* in spite of the fact that the same voltage is applied, because they are thinner than the regions 32*b*, the expansion of the regions 32*b* is not therefore interfered.

Therefore, when the potential of the electrodes 35*b* is increased in the positive direction, as indicated by (2) in FIG. 3D, an interaction between the expansion of the regions 31*b* and the expansion of the regions 32*b* causes the projections 33*a* provided between the regions 32*b* to incline in the direction of the arrow in FIG. 3D more than those in a conventional rotary ultrasonic motor to be urged against the rotor 34 more strongly than in the conventional rotary ultrasonic motor. As a result, the rotor 34 is moved in the direction of the arrow in FIG. 3D by a force greater than that in the conventional rotary ultrasonic motor.

The ultrasonic motor 3 thus causes the rotor 34 to be smoothly moved in the direction indicated by the arrow in FIG. 3D with a force greater than that in the conventional rotary ultrasonic motor.

As described above, in the ultrasonic motor 3 which is an embodiment of the invention, on the bottom surface of the piezoelectric element 32 corresponding to a piezoelectric element in a conventional rotary ultrasonic motor, the piezoelectric element 31 thinner than the piezoelectric element 32 is stacked such that it operates in the same direction as the piezoelectric element 32 in response to the same driving signal The piezoelectric element 31 therefore expands and contracts more than the piezoelectric element 32 to increase the output of the ultrasonic motor 3. While the current consumed by an ultrasonic motor increases with the capacity of the piezoelectric elements thereof, the current consumed can be reduced to improve efficiency by increasing the thickness of piezoelectric elements in a region whose factor of contribution to distortion is small.

Since the ultrasonic motor 3 thus makes the same operation as that of a conventional rotary ultrasonic motor with a greater force, the size and power consumption of the same can be smaller than those of the conventional rotary ultrasonic motor when they provide the same output.

Since the sum of the thickness of the piezoelectric elements 31 and 32 is equal to the thickness of the vibrator 33 and the interface between the piezoelectric element 32 and vibrator 33 acts as a distortion-neutral plane, a driving force originating from the expansion and contraction of the piezoelectric elements 31 and 32 is transmitted to the vibrator 33 most efficiently.

Any modification may be made on the present embodiment as long as it does not depart from the principle of the invention.

For example, any piezoelectric material may be used for the piezoelectric elements 31 and 32.

The optimum ratio between the thicknesses of the piezoelectric elements 31 and 32 is not uniquely determined, and it is rather determined by a plurality of factors such as the electromechanical coupling coefficient of the piezoelectric material and the surface area of the stacking surfaces of the piezoelectric elements.

The polarizing direction of each of the piezoelectric elements and the structure of the electrodes are not limited to the present embodiment, and any modification is possible as long as a plurality of stacked piezoelectric elements expand and contract in the same direction.

It is not essential to stack two piezoelectric elements, and what is required is that a plurality of piezoelectric elements are provided with a total thickness which is equal to the thickness of the vibrator. Especially, when three or more piezoelectric elements are stacked, it is not essential that they are all different in thickness depending on the stacking positions, and the same effect can be achieved even if some of them have the same thickness.

A description will now be made with reference to FIGS. 4A and 4B and FIG. 5 on an ultrasonic motor 4 which is a fourth embodiment of the invention.

Figure 4A:
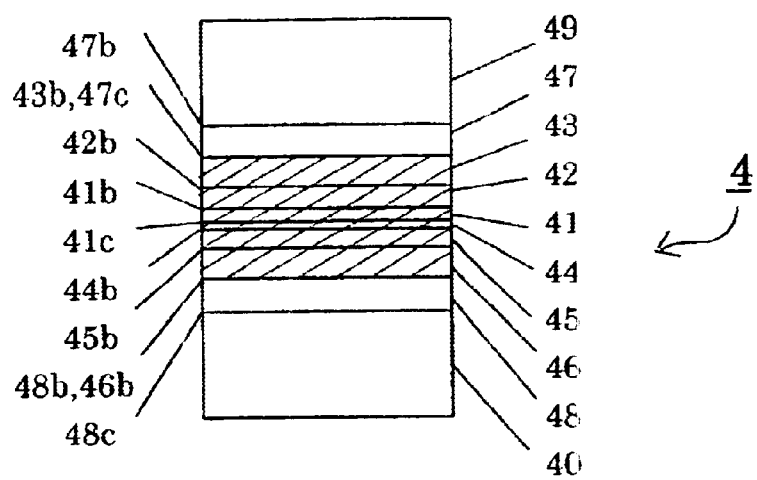
FIGS. 4A and 4B are schematic views illustrating a configuration of an ultrasonic motor 4 which is a fourth embodiment of the invention.
Figure 4B:
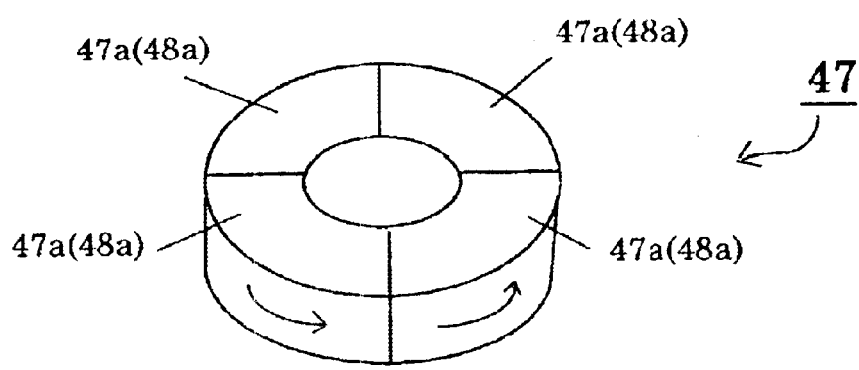

FIGS. 4A and 4B are schematic views illustrating a configuration of the ultrasonic motor 4. FIG. 5 is a schematic view illustrating an operation of the ultrasonic motor 4.

The configuration of the ultrasonic motor 4 will be first described with reference to FIGS. 4A and 4B.

As shown in FIG. 4A, the ultrasonic motor 4 is substantially comprised of a disc-shaped piezoelectric element 41, a disc-shaped piezoelectric element 42 stacked on the piezoelectric element 41, a disc-shaped piezoelectric element 43 stacked on the piezoelectric element 42, a disc-shaped piezoelectric element 44 stacked under the piezoelectric element 41, a disc-shaped piezoelectric element 45 stacked under the piezoelectric element 44, a disc-shaped piezoelectric element 46 stacked under the piezoelectric element 45, a disc-shaped piezoelectric element 47 stacked on the piezoelectric element 43, a disc-shaped piezoelectric element 48 stacked under the piezoelectric element 46, a vibrator 49 integrally stacked on the piezoelectric element 47 and a vibrator 40 integrally stacked under the piezoelectric element 48. It performs an operation to be detailed later to rotate a rotor 4a (shown in FIG. 5) which is located slightly above the vibrator 49 when not operated.

The piezoelectric elements 41 through 48 are all stacked integrally and are all equal in the diameter. The piezoelectric elements 41 through 46 are piezoelectric elements to cause expansion and contraction in the stacking direction, i.e., a longitudinal vibration, and the piezoelectric elements 47 and 48 are piezoelectric elements to cause a torsional vibration in the circumferential direction.

For example, the piezoelectric element 41 is made of barium titanate or lead zirconate titanate and is polarized in the direction of the thickness to have the positive polarity on the top surface thereof and the negative polarity on the bottom surface thereof.

The piezoelectric elements 42 and 43 are made of the same material as that of the piezoelectric element 41. The piezoelectric element 42 is thicker than the piezoelectric element 41, and the piezoelectric element 43 is thicker than the piezoelectric element 42.

Both of the piezoelectric elements 42 and 43 are polarized in the direction of the thickness thereof. The piezoelectric element 43 is polarized similarly to the piezoelectric element 41, and the piezoelectric element 42 is polarized to have the negative polarity on the top surface thereof and the positive polarity on the bottom surface thereof oppositely to the polarization of the piezoelectric element 41.

The piezoelectric elements 44, 45 and 46 are made of the same material as that of the piezoelectric element 41, and are equal in thickness to the piezoelectric elements 41, 42 and 43, respectively.

Each of the piezoelectric elements 44, 45 and 46 is polarized in the direction of the thickness thereof. The piezoelectric elements 44 and 46 are polarized similarly to the piezoelectric element 42, and the piezoelectric element 45 is polarized similarly to the piezoelectric element 41.

The piezoelectric elements 47 and 48 are made of the same material as that of the piezoelectric element 41 and, as shown in FIG. 4B, are respectively split into four equal sector regions 47a and 48a having a center angle of, for example, 90°.

The regions 47a and 48a are polarized in the circumferential direction thereof to have the polarity that changes from positive to negative counterclockwise when viewed from above, as shown in FIG. 4B.

An electrode 41b is provided to substantially cover the entire top surface of the piezoelectric element 41 to apply the same voltage to both of the top surface of the piezoelectric element 41 and the bottom surface of the piezoelectric element 42.

Similarly, an electrode 42b is provided to substantially cover the entire top surface of the piezoelectric element 42 to apply the same voltage to both of the top surface of the piezoelectric element 42 and the bottom surface of the piezoelectric element 43.

Similarly, an electrode 43b is provided to substantially cover the entire top surface of the piezoelectric element 43 to apply a voltage only to the top surface of the piezoelectric element 43.

An electrode 41c is provided to substantially cover the entire bottom surface of the piezoelectric element 41 to apply the same voltage to both of the bottom surface of the piezoelectric element 41 and the top surface of the piezoelectric element 44.

Similarly, an electrode 44b is provided to substantially cover the entire bottom surface of the piezoelectric element 44 to apply the same voltage to both of the bottom surface of the piezoelectric element 44 and the top surface of the piezoelectric element 45.

Similarly, an electrode 45b is provided to substantially cover the entire bottom surface of the piezoelectric element 45 to apply the same voltage to both of the bottom surface of the piezoelectric element 45 and the top surface of the piezoelectric element 46.

Similarly, an electrode 46b is provided to substantially cover the entire bottom surface of the piezoelectric element 46 to apply a voltage only to the bottom surface of the piezoelectric element 46.

Electrodes 47b, 47c, 48b and 48c are provided to substantially cover the entirety of the top surface of the piezoelectric element 47, the bottom surface of the same, the top surface of the piezoelectric element 48 and the bottom surface of the same, respectively.

The electrodes 41b, 43b, 44b and 46b are in conduction to each other, and the electrodes 41c, 42b and 45b are in conduction to each other.

The electrodes 47b and 48c are in conduction to each other, and the electrodes 47c and 48b are in conduction to each other.

An operation of the ultrasonic motor 4 will now be described with reference to FIG. 5.

Lest us first assume that an AC voltage is applied to the electrodes 41b, 43b, 44b and 46b as a driving signal with the electrodes 41c, 42b and 45b serving as reference electrodes which are grounded and that an AC voltage at a phase lag of 90° from the AC voltage applied to the electrodes 41b, 43b, 44b and 46b is applied to the electrodes 47b and 48c with the electrodes 47c and 48b serving as reference electrodes which are grounded.

A discussion will follow on a case wherein the electrodes 41b, 43b, 44b and 46b have a negative potential.

The piezoelectric element 41 expands in the direction of the thickness thereof, because the negative potential is applied by the electrode 41b to the positively polarized surface of the same and the negatively polarized surface thereof is grounded through the electrode 41c.

Similarly, since the negative potential is applied by the electrodes 41b, 43b, 44b, 44b and 46b to the respective positively polarized surfaces of the piezoelectric elements 42, 43, 44, 45 and 46 respectively and the negatively polarized surfaces thereof are grounded through the electrodes 42b, 41c, and 45b respectively, all of the piezoelectric elements expand in the direction of the thickness thereof.

The greater the distortion of a location in the mode of vibration to be achieved, the smaller the thickness of the piezoelectric element provided in the location. The piezoelectric elements 42 and 45 undergo expansion smaller than that of the piezoelectric elements 41 and 44 in spite of the fact that they are applied with the same voltage as those of the piezoelectric elements 41 and 44, because they are thicker than the piezoelectric elements 41 and 44. Similarly, the piezoelectric elements 43 and 46 undergo expansion smaller than that of the piezoelectric elements 42 and 45 in spite of the fact that they are applied with the same voltage as those the piezoelectric elements 42 and 45, because they are thicker than the piezoelectric elements 42 and 45.

Since the potential at the top surfaces of the piezoelectric elements 47 and 48 becomes positive relative to that at the bottom surfaces at a lag of 90° from the piezoelectric elements 42 through 46, contraction occurs at the upper part of a side thereof having the positive polarity while expansion occurs at the upper part of a side thereof having the negative polarity. Therefore, the top surface of the piezoelectric element 47 is twisted counterclockwise at a lag of 90° from the expansion of the piezoelectric elements 42 through 46.

Figure 5:
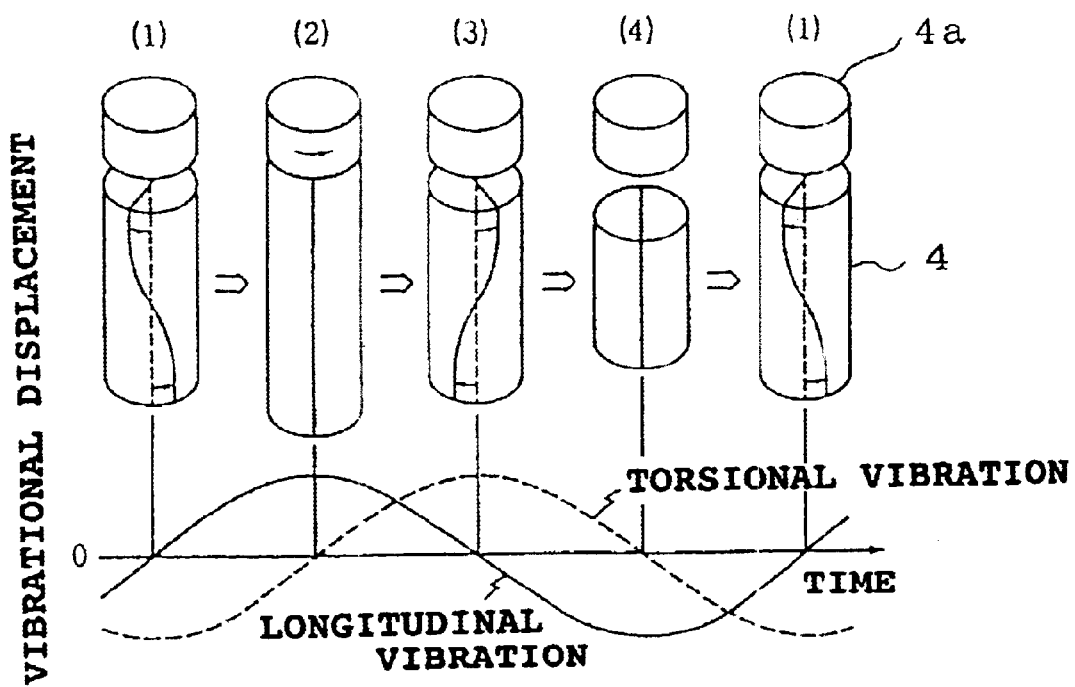
FIG. 5 is a schematic view illustrating an operation of the ultrasonic motor 4.

Therefore, as the voltage applied to the piezoelectric elements 41 through 46 increases in the negative direction, the ultrasonic motor 4 expands upward, recovers from clockwise twist and further twists counterclockwise as indicated by (1) and (2) in FIG. 5. As a result, it urges the rotor 4a and moves it counterclockwise.

Since the piezoelectric elements 41 through 46 having different thicknesses are integrally stacked, the expansion is greater than that in the prior art and the rotor 4a is therefore moved counterclockwise with a greater force.

When the voltage applied to the piezoelectric elements 41 through 46 has a different phase, the rotor 4a is not contacted because the piezoelectric elements 41 through 46 contract. Therefore, the rotor 4a is not moved as indicated by (3) and (4) in FIG. 5.

Then, the state indicated by (1) in FIG. 5 recurs, and the same operation is repeated.

A discussion will follow on a case wherein each of the electrodes 41b, 43b, 44b and 46b has a positive potential.

The piezoelectric element 41 contracts in the direction of the thickness thereof, because the positive potential is applied by the electrode 41b to the positively polarized surface of the same and the negatively polarized surface thereof is grounded through the electrode 41c.

Similarly, since the positive potential is applied by the electrodes 41b, 43b, 44b, 44b and 46b to the respective positively polarized surfaces of the piezoelectric elements 42, 43, 44, 45 and 46 respectively and the negatively polarized surfaces thereof are grounded through the electrodes 42b, 42b, 41c, 45b and 45b respectively, all of the piezoelectric elements contract in the direction of the thickness thereof.

The greater the distortion of a location in the mode of vibration to be achieved, the smaller the thickness of the piezoelectric element provided in the location. The piezoelectric elements 42 and 45 undergo contraction smaller than that of the piezoelectric elements 41 and 44 in spite of the fact that they are applied with the same voltage as those of the piezoelectric elements 41 and 44, because they are thicker than the piezoelectric elements 41 and 44. Similarly, the piezoelectric elements 43 and 46 undergo contraction smaller than that of the piezoelectric elements 42 and 45 in spite of the fact that they are applied with the same voltage as those of the piezoelectric elements 42 and 45, because they are thicker than the piezoelectric elements 42 and 45.

Since the potential at the top surfaces of the piezoelectric elements 47 and 48 becomes negative relative to that of the bottom surfaces at a lag of 90° from the piezoelectric elements 42 through 46, expansion occurs at the upper part of a side thereof having the positive polarity while contraction occurs at the upper part of a side thereof having the negative polarity. Therefore, the top surface of the piezoelectric element 47 is twisted clockwise at a lag of 90° from the expansion of the piezoelectric elements 42 through 46.

Therefore, as the voltage applied to the piezoelectric elements 41 through 46 increases in the negative direction, the ultrasonic motor 4 expands upward, recovers from counterclockwise twist and further twists clockwise, although not shown. As a result, it urges the rotor 4a and moves it clockwise.

Since the piezoelectric elements 41 through 46 having different thicknesses are integrally stacked, the expansion is greater than that in the prior art and the rotor 4a is therefore moved clockwise with a greater force.

When the voltage applied to the piezoelectric elements 41 through 46 has a different phase, the rotor 4a is not contacted because the piezoelectric elements 41 through 46 contract. Therefore, the rotor 4a is not moved.

As described above, in the ultrasonic motor 4 which is an embodiment of the invention, the piezoelectric elements 41 through 46 for a longitudinal vibration are integrally stacked, and the piezoelectric elements 47 and 48 for a torsional vibration are integrally stacked above and under the same, to which a driving signal separate from that to the piezoelectric elements 41 through 46 is input. Therefore, an adjustment of the driving signal allows the ultrasonic motor 4 to be urged against the rotor 4a only when the piezoelectric elements 41 through 46 expand, i.e., when the piezoelectric elements 47 and 48 are twisted in one direction. Further, the piezoelectric elements 41 through 46 have different thicknesses depending on the distribution of distortion. Therefore, the ultrasonic motor 4 causes the rotor 4a to rotate in a predetermined direction with a force greater than that in the prior art and with reduced power consumption.

The ratio between the strengths of longitudinal and torsional vibrations can be adjusted to an optimum value by adjusting the ratio between the thicknesses of the piezoelectric elements 41 through 46 and the thicknesses of the piezoelectric elements 47 and 48 appropriately.

Any modification may be made on the present embodiment as long as it does not depart from the principle of the invention.

For example, any piezoelectric material may be used for the piezoelectric elements 41 through 48.

The optimum ratio between the thicknesses of the piezoelectric elements 41 through 46 is not uniquely determined, and it is rather determined by a plurality of factors such as the modes of vibration, the electromechanical coupling coefficient of the piezoelectric material and the surface area of the stacking surfaces of the piezoelectric elements 41 through 46.

The method and direction of stacking the piezoelectric elements for longitudinal and torsional vibrations are not limited to the present embodiment.

Figure 6A:
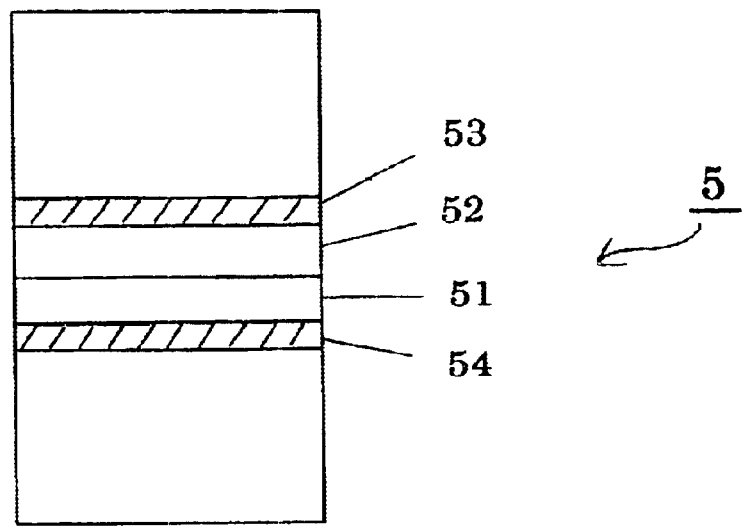
FIGS. 6A and 6B are schematic views respectively illustrating configurations of ultrasonic motor motors 5 and 6 which are modifications of the ultrasonic motor 4.

For example, the same effect can be achieved by an ultrasonic motor 5 as shown in FIG. 6A in which piezoelectric elements 51 and 52 for a torsional vibration having the same polarizing structure as that of the piezoelectric element 47 are stacked and piezoelectric elements 53 and 54 for a longitudinal vibration having the same polarizing structure as that of the piezoelectric element 41 are stacked on both of the end faces of the piezoelectric elements 51 and 52. For example, when both of the longitudinal and torsional vibrations are first-order modes of vibration, the distortion is greatest in the central region and decreases toward both ends. Therefore, the balance between those vibrations is maintained by making the piezoelectric elements for the longitudinal vibration provided at the periphery thicker than the piezoelectric elements for the torsional vibration provided in the middle.

Figure 6B:
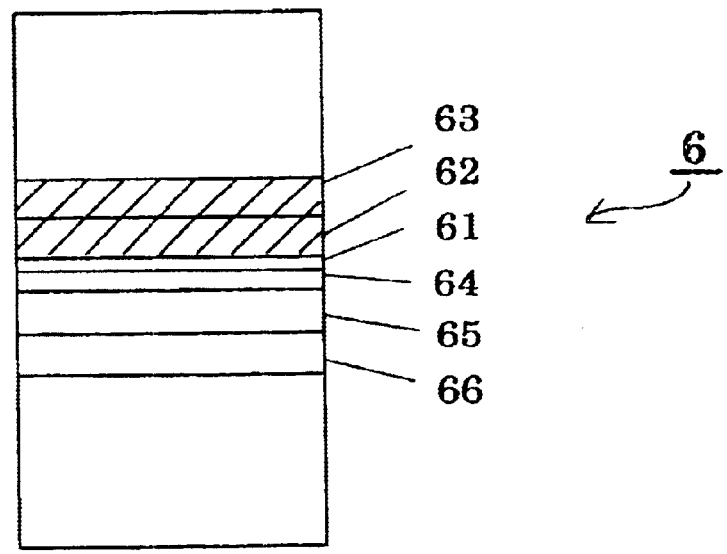

Further, the same effect can be achieved by an ultrasonic motor 6 as shown in FIG. 6B in which a piezoelectric element 62 for a longitudinal vibration thicker than a piezoelectric element 61 and a piezoelectric element 63 for a longitudinal vibration thicker than the piezoelectric element 62 are stacked on the piezoelectric element 61 for a longitudinal vibration having the same polarizing structure as that of the piezoelectric element 41 and in which a piezoelectric element 64 for a torsional vibration having the same polarizing structure as that of the piezoelectric element 47, a piezoelectric element 65 for a torsional vibration thicker than the piezoelectric element 64 and a piezoelectric element 66 for a torsional vibration thicker than the piezoelectric element 65 are stacked under the piezoelectric element 61.

While both of the longitudinal and torsional vibrations used here are first-order modes of vibration, the invention is not limited thereto. Higher-order modes of vibration may be used, and it is not essential that the two modes of vibration are of the same order. Such alternative arrangements will provide the same effect as that described above as long as the piezoelectric elements have different thicknesses depending on the distribution of distortion.

A description will now be made with reference to FIGS. 7A through 7D and FIG. 8 on an ultrasonic motor 7 which is a fifth embodiment of the invention.

Figure 7A:
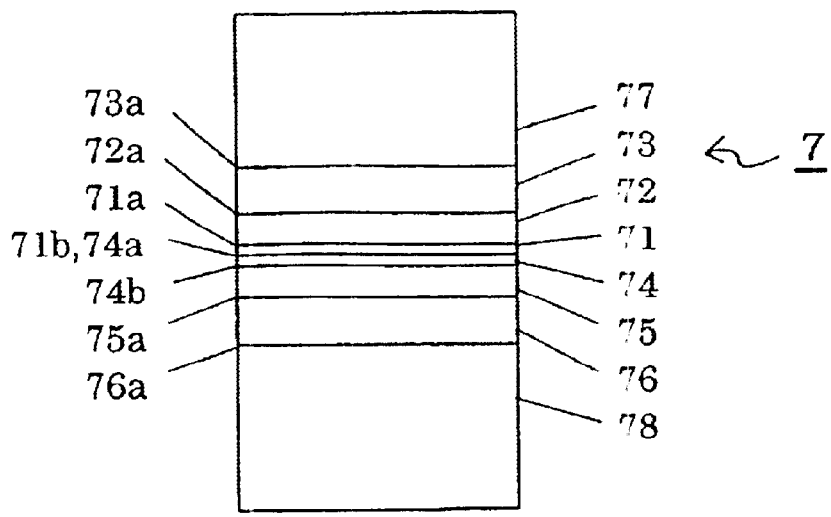
Figure 7B:
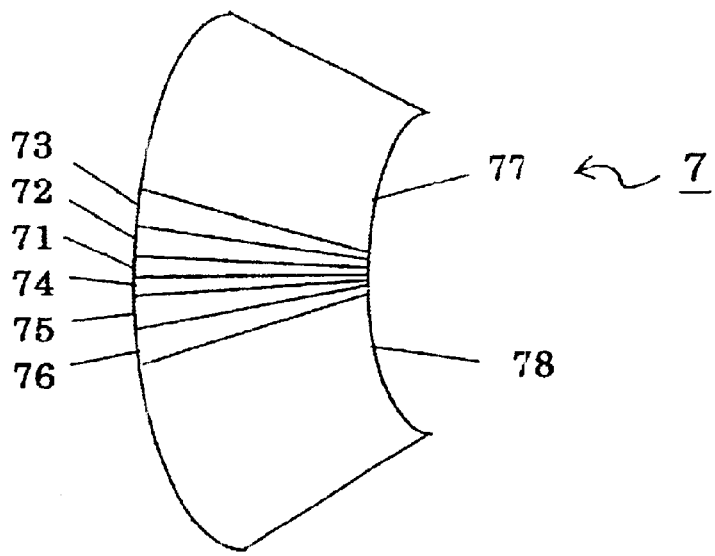
Figure 7C:
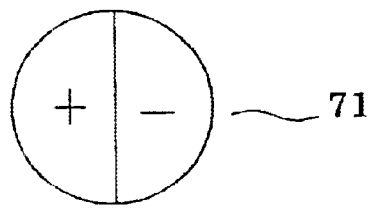
Figure 7D:
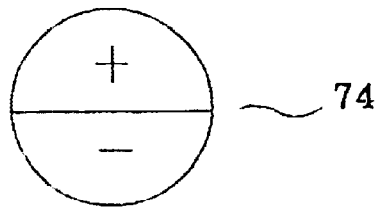
Figure 8:
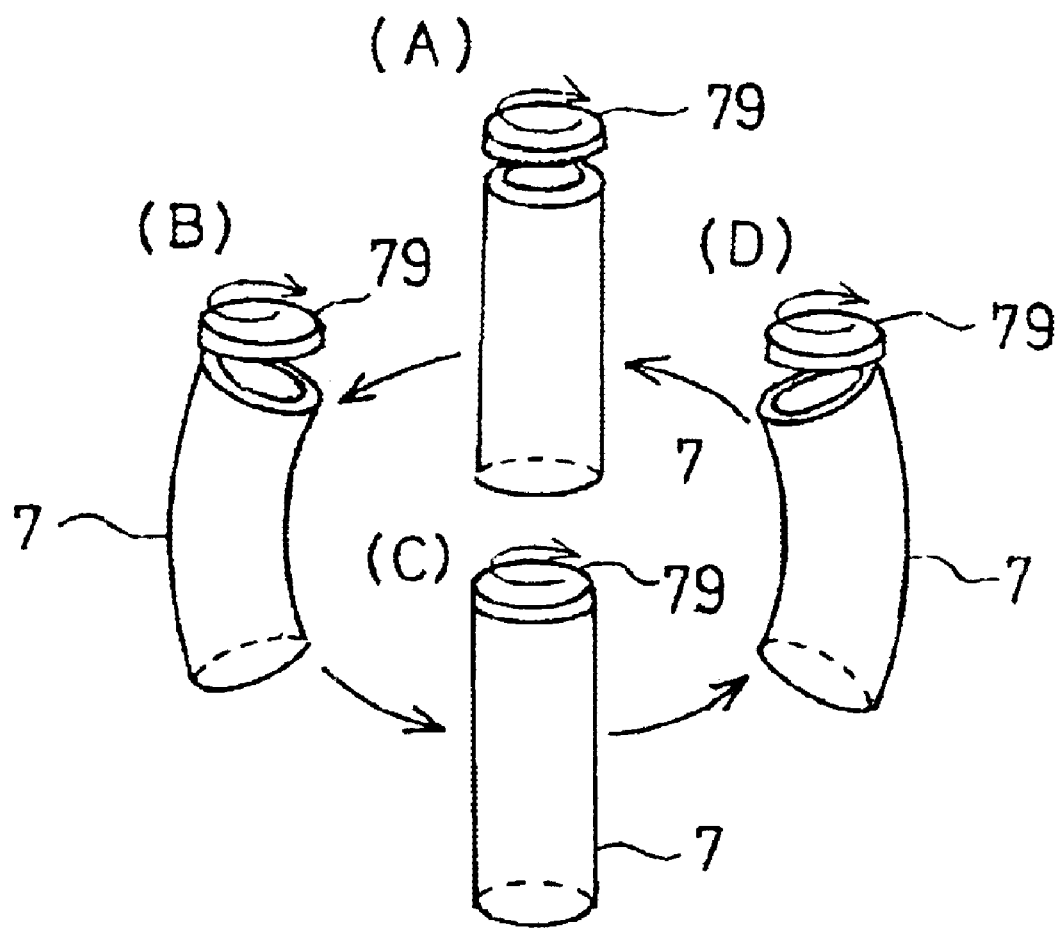
FIG. 8 is a schematic view illustrating an operation of the ultrasonic motor 7.

FIGS. 7A through 7D are schematic views illustrating a configuration of an ultrasonic motor 7 which is a fifth embodiment of the invention, and FIG. 8 is a schematic view illustrating an operation of the ultrasonic motor 7.

The configuration of the ultrasonic motor 7 will be first described.

As shown in FIG. 7A, the ultrasonic motor 7 is substantially comprised of a disc-shaped piezoelectric element 71, a disc-shaped piezoelectric element 72 stacked on the piezoelectric element 71, a disc-shaped piezoelectric element 73 stacked on the piezoelectric element 72, a disc-shaped piezoelectric element 74 stacked under the piezoelectric element 71, a disc-shaped piezoelectric element 75 stacked under the piezoelectric element 74, a disc-shaped piezoelectric element 76 stacked under the piezoelectric element 75, a vibrator 77 integrally stacked on the piezoelectric element 73 and a vibrator 78 integrally stacked under the piezoelectric element 76. It performs an operation to be detailed later to rotate a rotor 79 which is located slightly above the vibrator 78.

The piezoelectric elements 71 through 76 are all stacked integrally and are all equal in the radius. The interface between the piezoelectric elements 71 and 74 constitutes a distortion-neutral plane in the context of the invention.

For example, the piezoelectric element 71 is made of barium titanate or lead zirconate titanate. As shown in the plan view in FIG. 7C, the piezoelectric element 71 is split into two semicircles which are polarized oppositely in the direction of the thickness thereof.

The piezoelectric element 72 is fabricated thicker than the piezoelectric element 71 using the same material as that of the piezoelectric element 71. The piezoelectric element 72 is split into two semicircles in the same direction as that of the piezoelectric element 71 and is polarized oppositely to the piezoelectric element 71.

The piezoelectric element 73 is fabricated thicker than the piezoelectric element 72 using the same material as that of the piezoelectric element 71. The piezoelectric element 73 is split into two semicircles in the same direction as that of the piezoelectric element 71 and is polarized similarly to the piezoelectric element 71.

The piezoelectric element 74 is fabricated with the same thickness as that of the piezoelectric element 71 using the same material as that of the piezoelectric element 71. As shown in the plan view in FIG. 7D, the piezoelectric element 74 is split into two semicircles which are polarized oppositely in the direction of the thickness thereof. The piezoelectric element 74 is split in a direction orthogonal to the direction in which the piezoelectric element 71 is split.

The piezoelectric element 75 is fabricated with the same thickness as that of the piezoelectric element 72 using the same material as that of the piezoelectric element 71. The piezoelectric element 75 is split into two semicircles in the same direction as that of the piezoelectric element 74 and is polarized oppositely to the piezoelectric element 74.

The piezoelectric element 76 is fabricated with the same thickness as that of the piezoelectric element 73 using the same material as that of the piezoelectric element 71. The piezoelectric element 76 is split into two semicircles in the same direction as that of the piezoelectric element 74 and is polarized similarly to the piezoelectric element 74.

An electrode 71a is provided to substantially cover the entire top surface of the piezoelectric element 71 to apply the same voltage to both of the top surface of the piezoelectric element 71 and the bottom surface of the piezoelectric element 72.

Similarly, an electrode 72a is provided to substantially cover the entire top surface of the piezoelectric element 72 to apply the same voltage to both of the top surface of the piezoelectric element 72 and the bottom surface of the piezoelectric element 73.

An electrode 73a is provided to substantially cover the entire top surface of the piezoelectric element 73 to apply a voltage to the top surface of the piezoelectric element 73.

An electrode 71b is provided to substantially cover the entire bottom surface of the piezoelectric element 71 to apply a voltage to the bottom surface of the piezoelectric element 71.

An electrode 74a is provided to substantially cover the entire top surface of the piezoelectric element 74 to apply a voltage to the top surface of the piezoelectric element 74.

An electrode 74b is provided to substantially cover the entire bottom surface of the piezoelectric element 74 to apply the same voltage to both of the bottom surface of the piezoelectric element 74 and the top surface of the piezoelectric element 75.

Similarly, an electrode 75a is provided to substantially cover the entire bottom surface of the piezoelectric element 75 to apply the same voltage to both of the bottom surface of the piezoelectric element 75 and the top surface of the piezoelectric element 76.

An electrode 76a is provided to substantially cover the entire bottom surface of the piezoelectric element 76 to apply a voltage to the bottom surface of the piezoelectric element 76.

The electrodes 71a and 73a are in conduction to each other, and the electrodes 71b and 72a are in conduction to each other.

The electrodes 74a and 75a are in conduction to each other, and the electrodes 74b and 76a are in conduction to each other, Flexible substrates, metal plates and the like may be used as those electrodes for applying signals without any restriction.

Methods for bonding the piezoelectric elements, electrodes and vibrators include the use of an adhesive or a structure in which they are bored in the middle to be fastened and secured together with a bolt and nuts or the like.

An operation of the ultrasonic motor 7 will now be described.

Lest us first assume that an AC voltage is applied to the electrodes 71a and 73a as a driving signal with the electrodes 71b and 72a serving as reference electrodes and that an AC voltage at a phase lag of 90° from the AC voltage applied to the electrodes 71a and 73a is applied to the electrodes 74a and 75a with the electrodes 74b and 76a serving as reference electrodes.

When the voltage applied to the electrodes 71a and 73a is increased in the negative direction, the left half of the piezoelectric elements 71, 72 and 73 as viewed in FIG. 7C expands in the direction of the thickness thereof because a negative voltage is applied to the positively polarized surfaces thereof through the electrodes 71a and 73a, and the right half contracts in the direction of the thickness because a negative voltage is applied to the negatively polarized surfaces thereof.

Since the voltage applied to the electrodes 74a and 75a approaches to zero from a negative value, the piezoelectric elements 74, 75 and 76 undergo smaller distortion.

Therefore, as shown in FIG. 7B and (B) in FIG. 8, the ultrasonic motor 7 expands at the left side and contracts at the right side and undergoes smaller distortion this side and the further side of the plane of the drawings when viewed as a whole. As a result, the rotor 79 is rotated in the direction indicated by the arrow at (B) in FIG. 8.

Since the piezoelectric elements 71, 72 and 73 have thicknesses that increase in the same order as they are listed, a piezoelectric element undergoes greater distortion, the greater the distortion of the location of the same in the mode of vibration to be achieved. Therefore, it allows the amount of distortion or driving force of the ultrasonic motor 7 to be increased without interfering with the expansion or contraction of other piezoelectric elements. In addition, a piezoelectric element in a location with a small factor of contribution to driving has a great thickness, which allows reductions in the capacity and power consumption.

When the voltage applied to the electrodes 71a and 73a approaches to zero from a negative value, the piezoelectric elements 71, 72 and 73 undergo smaller distortion.

At this time, the voltage applied to the electrodes 74a and 75a increases in the positive direction. Therefore, the upper half of the piezoelectric elements 74, 75 and 76 as viewed in FIG. 7D contracts in the direction of the thickness thereof because a positive voltage is applied to the positively polarized surfaces thereof through the electrodes 74a and 75a, and the lower half expands in the direction of the thickness because a positive voltage is applied to the negatively polarized surfaces thereof.

Therefore, as indicated by (C) in FIG. 8, the ultrasonic motor 7 expands at this side of the plane of the drawing and contracts at its further side, and undergoes smaller distortion at the left and right side thereof when viewed as a whole. As a result, the rotor 79 is rotated in the direction indicated by the arrow at (B) in FIG. 8.

Since the piezoelectric elements 74, 75 and 76 have thicknesses that increase in the same order as they are listed, a piezoelectric element undergoes greater distortion, the greater the distortion of the location of the same in the mode of vibration to be achieved. Therefore, it allows the amount of distortion or driving force of the ultrasonic motor 7 to be increased without interfering with the expansion or contraction of other piezoelectric elements. In addition, a piezoelectric element in a location with a small factor of contribution to driving has a great thickness, which allows reductions in the capacity and power consumption.

When the voltage applied to the electrodes 71a and 73a is increased in the positive direction, the left half of the piezoelectric elements 71, 72 and 73 as viewed in FIG. 7C contracts in the direction of the thickness thereof because a positive voltage is applied to the positively polarized surfaces thereof through the electrodes 71a and 73a, while the right half expands in the direction of the thickness because a positive voltage is applied to the negatively polarized surfaces thereof.

Since the voltage applied to the electrodes 74a and 75a approaches to zero from a positive value, the piezoelectric elements 74, 75 and 76 undergo smaller distortion.

Therefore, as indicated by (D) in FIG. 8, the ultrasonic motor 7 contracts at the left side and expands at the right side, and undergoes smaller distortion this side and the further side of the plane of the drawing when viewed as a whole. As a result, the rotor 79 is rotated in the direction indicated by the arrow at (B) in FIG. 8.

Since the piezoelectric elements 71, 72 and 73 have thicknesses that increase in the same order as they are listed, a piezoelectric element undergoes greater distortion, the greater the distortion of the location of the same in the mode of vibration to be achieved. Therefore, it allows the amount of distortion or driving force of the ultrasonic motor 7 to be increased without interfering with the expansion or contraction of other piezoelectric elements. In addition, a piezoelectric element in a location with a small factor of contribution to driving has a great thickness, which allows reductions in the capacity and power consumption.

When the voltage applied to the electrodes 71a and 73a approaches to zero from a positive value, the piezoelectric elements 71, 72 and 72 undergo smaller distortion.

At this time, the voltage applied to the electrodes 74a and 75a increases in the negative direction. Therefore, the upper half of the piezoelectric elements 74, 75 and 76 as viewed in FIG. 7D expands in the direction of the thickness thereof because a negative voltage is applied to the positively polarized surfaces thereof through the electrodes 74a and 75a, and the lower half contracts in the direction of the thickness because a negative voltage is applied to the negatively polarized surfaces thereof.

Therefore, as indicated by (A) in FIG. 8, the ultrasonic motor 7 contracts at this side of the plane of the drawing and expands at its further side, and undergoes smaller distortion at the left and right side thereof when viewed as a whole. As a result, the rotor 79 is rotated in the direction indicated by the arrow at (B) in FIG. 8.

Since the piezoelectric elements 74, 75 and 76 have thicknesses that increase in the same order as they are listed, a piezoelectric element undergoes greater distortion, the greater the distortion of the location of the same in the mode of vibration to be achieved. Therefore, it allows the amount of distortion or driving force of the ultrasonic motor 7 to be increased without interfering with the expansion or contraction of other piezoelectric elements. In addition, a piezoelectric element in a location with a small factor of contribution to driving has a great thickness, which allows reductions in the capacity and power consumption.

That is, the expansion of the ultrasonic motor 7 occurs in the order of the left side, this side, right side and further side of the plane of FIG. 8 to rotate the rotor 79 clockwise.

When an AC voltage at a phase lag of 90° from the AC voltage applied to the electrodes 71a and 73a is applied to the electrodes 74a and 75a with the electrodes 74b and 76a serving as reference electrodes, the expansion occurs, in contrast to FIG. 8, in the order of the left side, further side, right side and this side to rotate the rotor 79 counterclockwise.

Since the piezoelectric elements 71, 72 and 73 and the piezoelectric elements 74, 75 and 76 have thicknesses that increase in the same order as they are listed, a piezoelectric element undergoes greater distortion, the greater the distortion of the location of the same in the mode of vibration to be achieved. Therefore, it allows the amount of distortion or driving force of the ultrasonic motor 7 to be increased without interfering with the expansion or contraction of other piezoelectric elements. In addition, a piezoelectric element in a location with a small factor of contribution to driving has a great thickness, which allows reductions in the capacity and power consumption and also leads to the improvement in efficiency.

As described above, in the ultrasonic motor 7 which is an embodiment of the invention, the piezoelectric element 72 thicker than the piezoelectric element 71 and the piezoelectric element 73 thicker than the piezoelectric element 72 are integrally stacked on the piezoelectric element 71 as a source of a driving force, and the piezoelectric element 74 having the same thickness as that of the piezoelectric element 71, the piezoelectric element 75 having the same thickness as that of the piezoelectric element 72 and the piezoelectric element 76 having the same thickness as that of the piezoelectric element 73 are integrally stacked under the piezoelectric element 71. As a result, the piezoelectric elements 71 through 76 increase the amount of distortion of the ultrasonic motor 7 without interfering with the expansion and contraction of other piezoelectric elements. The driving force of the ultrasonic motor 7 is thus increased, and the capacity and power consumption can be reduced because a piezoelectric element in a location that has a small factor of contribution to driving has a great thickness.

Any modification may be made on the present embodiment as long as it does not depart from the principle of the invention.

For example, any piezoelectric material may be used for the piezoelectric elements 71 through 76.

The optimum ratio between the thicknesses of the piezoelectric elements 71 through 76 is not uniquely determined, and it is rather determined by a plurality of factors such as the electromechanical coupling coefficient of the piezoelectric material and the surface area of the stacking surfaces of the piezoelectric elements 71 through 76.

Further, the method and direction of stacking the piezoelectric elements 71 through 76 are not limited to the present embodiment. For example, the same effect can be achieved even when the polarizing structure of the piezoelectric element 71 is adopted for all of the piezoelectric elements 71 through 73 and the polarizing structure of the piezoelectric element 74 is adopted for all of the piezoelectric elements 74 through 76. There is no limitation on the structure of the electrodes. For example, in a structure wherein stacked piezoelectric elements are integrally sintered, the electrode on each layer used at the time of polarization may be shorted at the inner or outer circumference of the piezoelectric element or shorted with a through hole to excite a desired vibration in response to an input signal.

Further, although a first-order mode of bending is used here, the invention is not limited to the same and a higher-order mode may be used. The same effect as described above can be achieved also in such a case only by changing the thickness of the piezoelectric elements depending on the distribution of distortion.

Figure 9:
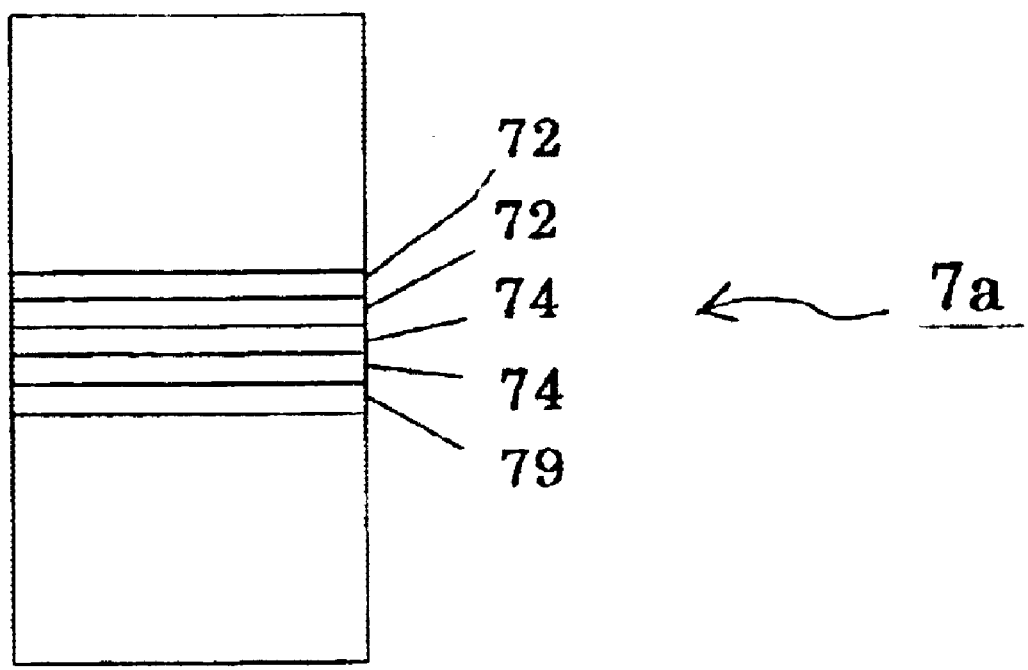
FIG. 9 is a schematic view illustrating a configuration of an ultrasonic motor 7a which is a modification of the ultrasonic motor 7.

FIG. 9 is a schematic view illustrating a configuration of an ultrasonic motor 7a which is a modification of the ultrasonic motor 7.

The ultrasonic motor 7a has a structure in which piezoelectric elements 74 are integrally stacked under piezoelectric elements 72 which are integrally stacked, and a piezoelectric element 79 for detecting a signal used for self-excited vibration or driving and control based on separate excitation is integrally stacked under the same.

For example, the piezoelectric element 79 is fabricated with a thickness smaller than those of the piezoelectric elements 72 and 74 using barium titanate or lead zirconate titanate and is polarized in the direction of the thickness to have the positive polarity on the top surface thereof and the negative polarity on the bottom surface thereof.

The piezoelectric element 79 has four electrodes provided, for example, at every 90° for detecting the state of distortion of the ultrasonic motor 7a as an electrical signal.

In the ultrasonic motor 7a having the above-described configuration, although the piezoelectric element 79 is provided in a region which undergoes distortion smaller than that of the region of the piezoelectric elements 72, it exhibits a high detecting capability without interfering with the distortion of the piezoelectric elements 72 and 74 as a source of a driving force, because it is thinner than the piezoelectric elements 72 and 74.

There is no need for providing the piezoelectric elements 72 and 74 with electrodes for detecting a vibration, and the piezoelectric elements 72 and 74 as a whole are used as a source of a driving force. It is therefore possible to obtain a driving force greater than that available in the prior art.

Especially, when the ultrasonic motor 7a is a high power ultrasonic motor, although the piezoelectric elements 72 and 74 must be thick enough to maintain the strength of the ultrasonic motor 7a, there is no reduction in the vibration detecting capability of the ultrasonic motor 7a, because the piezoelectric element 79 for detecting a vibration is provided separately from the piezoelectric elements 72 and 74.

The present embodiment is not limiting the invention, and the same effect can be achieved in piezoelectric actuators including any type of ultrasonic motor by providing a separate piezoelectric element for detecting a vibration with a thickness smaller than that of a piezoelectric element for driving in addition to piezoelectric elements for driving.

A detailed description will be made with reference to FIGS. 10A through 10B and FIGS. 11A through 11C on an ultrasonic motor 8 which is the sixth embodiment of the invention.

Figure 10A:
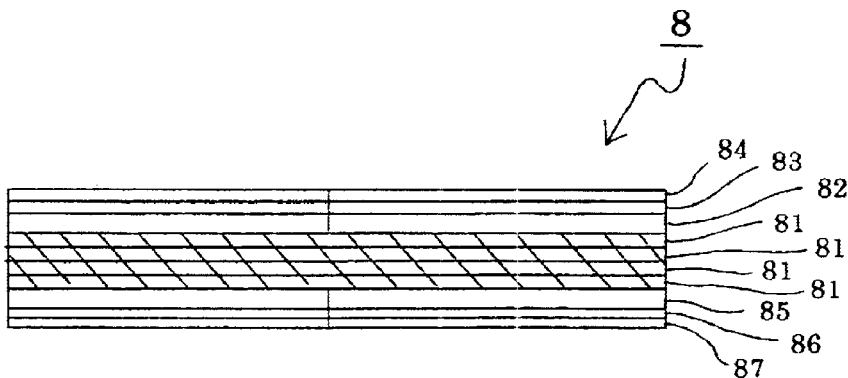
FIGS. 10A through 10E are schematic views illustrating a configuration of an ultrasonic motor 8 which is a sixth embodiment of the invention.
Figure 10B:
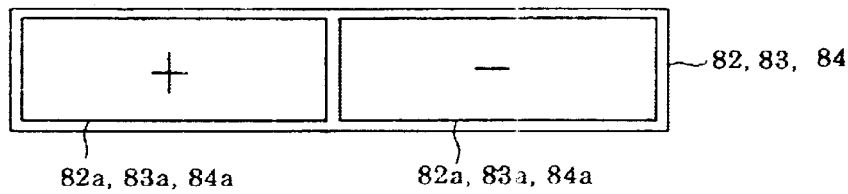
Figure 10C:
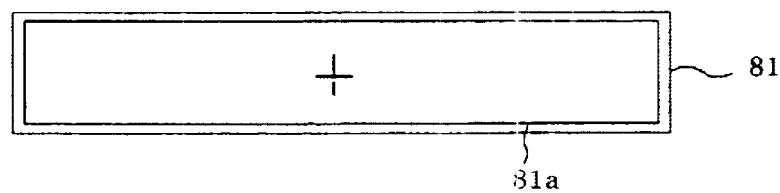
Figure 10D:
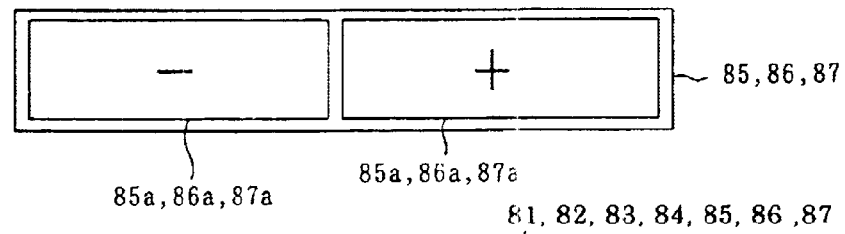
Figure 10E:
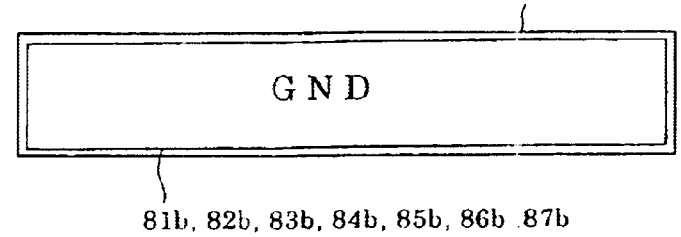
Figure 11A:
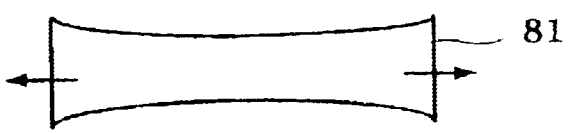
FIG. 11A through 11C are schematic views illustrating an operation of the ultrasonic motor 8.
Figure 11B:
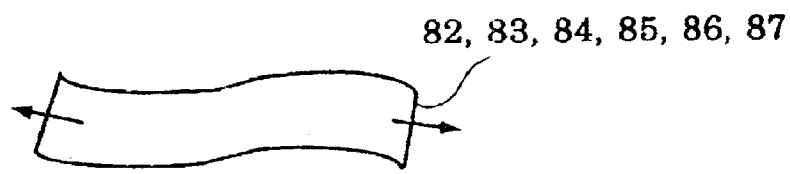
Figure 11C:
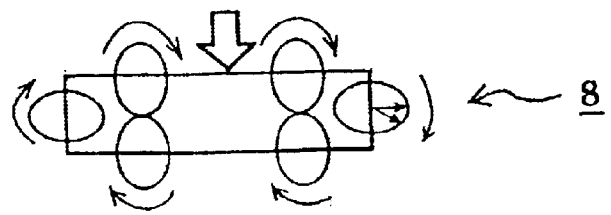

FIGS. 10A through 10E are schematic views illustrating a configuration of the ultrasonic motor 8, and FIGS. 11A through 11C are schematic views illustrating an operation of the ultrasonic motor 8.

The configuration of the ultrasonic motor 8 will now be described.

The ultrasonic motor 8 is substantially comprised of four rectangular piezoelectric elements 81 which are integrally stacked, three rectangular piezoelectric elements 82, 83 and 84 integrally stacked on the piezoelectric elements 81 and three rectangular piezoelectric elements 85, 86 and 87 integrally stacked under the piezoelectric elements 81.

The piezoelectric elements 81 are piezoelectric elements for generating a longitudinal vibration, and the piezoelectric elements 82 through 87 are piezoelectric elements for generating a bending vibration. That is, the ultrasonic motor 8 is an ultrasonic motor which moves a movable element with an elliptical vibration generated on end faces and sides thereof as a result of synthesis of a longitudinal vibration and a bending vibration.

All of the piezoelectric elements 81 through 87 have a same surface configuration.

The bottom surface of the second piezoelectric element 81 from the top constitutes a distortion-neutral plane in the context of the invention.

For example, the piezoelectric element 81 is fabricated from barium titanate or lead zirconate titanate and is polarized in the direction of the thickness to have the positive polarity on the top surface as shown in the plan view of FIG. 10C.

Electrodes 81a and 81b are respectively provided on the top and bottom surfaces of the piezoelectric element 81.

The piezoelectric element 82 is fabricated using the same material as that of the piezoelectric element 81. As shown in the plan view of FIG. 10B, the piezoelectric element 82 has two rectangular polarized regions which are oppositely polarized in the direction of the thickness thereof, for example, to have the positive polarity on the top surface of the region on the left side of FIG. 10B and the negative polarity on the top surface of the region on the right side of FIG. 10B. Electrodes 82a are provided on the upper surfaces of the two polarized regions, and a single continuous electrode 82b is provided on the bottom surfaces of the same.

The piezoelectric element 83 is made with a thickness smaller than that of the piezoelectric element 82 using the same material as that of the piezoelectric element 81.

The piezoelectric element 84 is made with a thickness smaller than that of the piezoelectric element 83 using the same material as that of the piezoelectric element 81.

The polarizing structure of the piezoelectric elements 83 and 84 is the same as that of the piezoelectric element 82. Similarly to the piezoelectric element 82, electrodes 83a and electrodes 84a are provided on the upper surfaces of the respective polarized regions, and two single continuous electrodes 83b and 84b are provided on the respective bottom surfaces.

The piezoelectric element 85 is fabricated to have the same thickness as that of the piezoelectric element 82 using the same material as that of the piezoelectric element 81. As shown in the plan view of FIG. 10D, the piezoelectric element 85 has two rectangular polarized regions with the same configuration as that of the piezoelectric element 82, which are polarized oppositely to the piezoelectric element 82 in the direction of the thickness thereof, for example, to have the negative polarity on the top surface of the region on the left side of FIG. 10D and the negative polarity on the top surface of the region on the right side of FIG. 10D. Electrodes 85a are provided on the upper surfaces of the two polarized regions, and a single continuous electrode 85b is provided on the bottom surfaces of the same.

The piezoelectric element 86 is made with the same thickness as that of the piezoelectric element 83 using the same material as that of the piezoelectric element 81.

The piezoelectric element 87 is made with the same thickness as that of the piezoelectric element 84 using the same material as that of the piezoelectric element 81.

The polarizing structure of the piezoelectric elements 86 and 87 is the same as that of the piezoelectric element 85. Similarly to the piezoelectric element 85, electrodes 86a and electrodes 87a are provided on the upper surfaces of the respective polarized regions, and two single continuous electrodes 86b and 87b are provided on the respective bottom surfaces.

All of the electrodes 82a, 83a, 84a, 85a, 86a and 87a are in conduction to each other. Further, all of the electrodes 81b, 82b, 83b, 84b, 85b, 86b and 87b are grounded.

An operation of the ultrasonic motor 8 will now be described.

First, a discussion follows on a case wherein an AC voltage is applied to all electrodes 81a as a driving signal with the electrodes 81b serving as reference electrodes and wherein an AC voltage at a phase lead of 90° from the AC voltage applied to the electrodes 81a is applied to the electrodes 82a through 87a with the electrodes 82b through 87b serving as reference electrodes.

When the voltage applied to the electrodes 81a increases in the negative direction, the piezoelectric elements 81 expand in the longitudinal direction as shown in FIG. 11A because a negative voltage is applied to the positively polarized surfaces thereof. Therefore, an end face of the ultrasonic motor 8 is brought into contact with the movable element (not shown).

At this time, since the voltage applied to the electrodes 82a through 87a increases in the positive direction, a positive voltage is applied to the top surfaces of the piezoelectric elements 82 through 87. Therefore, the left half of the piezoelectric elements 82 through 84 contracts and the right half of the same expands, while the left half of the piezoelectric elements 85 through 87 expands and the right half thereof contracts.

As a result, the ultrasonic motor 8 is distorted as indicated by the sectional view of FIG. 11B.

The piezoelectric elements 82 through 84 have thicknesses that decrease as the distance from the distortion-neutral plane increases and therefore increase the amount of distortion of the ultrasonic motor 8 without interfering with the expansion and contraction of other piezoelectric elements.

Similarly, the piezoelectric elements 85 through 87 have thicknesses that decrease as the distance from the distortion-neutral plane increases and therefore increase the amount of distortion of the ultrasonic motor 8 without interfering with the expansion and contraction of other piezoelectric elements.

As a result, the ultrasonic motor 8 moves the movable body which is in contact with the end face of the ultrasonic motor 8 in the direction indicated by the arrow in FIG. 11C.

When the voltage applied to the electrodes 81a increases in the positive direction, the piezoelectric elements 81 contract in the longitudinal direction because a positive voltage is applied to the positively polarized surfaces thereof. Therefore, the end face of the ultrasonic motor 8 is not brought into contact with the movable element (not shown) and hence no driving force is transmitted to the movable element.

Next, a discussion follows on a case wherein an AC voltage is applied to all electrodes 81a as a driving signal with the electrodes 81b serving as reference electrodes and wherein an AC voltage having the same phase as the AC voltage applied to the electrodes 81a is applied to the electrodes 82a through 87a with the electrodes 82b through 87b serving as reference electrodes.

When the voltage applied to the electrodes 81a increases in the negative direction, the piezoelectric elements 81 expand in the longitudinal direction as shown in FIG. 11A because a negative voltage is applied to the positively polarized surfaces thereof. Therefore, the end face of the ultrasonic motor 8 is brought into contact with the movable element (not shown).

At this time, since the voltage applied to the electrodes 82a through 87a increases in the negative direction, a negative voltage is applied to the top surfaces of the piezoelectric elements 82 through 87. Therefore, the left half of the piezoelectric elements 82 through 84 expands and the right half of the same contracts, while the left half of the piezoelectric elements 85 through 87 contracts and the right half thereof expands.

As a result, the ultrasonic motor 8 undergoes distortion opposite to that indicated by the sectional view of FIG. 11B.

The piezoelectric elements 82 through 84 have thicknesses that decrease as the distance from the distortion-neutral plane increases and therefore increase the amount of distortion of the ultrasonic motor 8 without interfering with the expansion and contraction of other piezoelectric elements.

Similarly, the piezoelectric elements 85 through 87 have thicknesses that decrease as the distance from the distortion-neutral plane increases and therefore increase the amount of distortion of the ultrasonic motor 8 without interfering with the expansion and contraction of other piezoelectric elements.

As a result, the ultrasonic motor 8 moves the movable body which is in contact with the end face of the ultrasonic motor 8 in a direction opposite to the direction indicated by the arrow in FIG. 11C.

When the voltage applied to the electrodes 81a increases in the positive direction, the piezoelectric elements 81 contract in the longitudinal direction because a positive voltage is applied to the positively polarized surfaces thereof Therefore, the end face of the ultrasonic motor 8 is not brought into contact with the movable element (not shown) and hence no driving force is transmitted to the movable element.

As described above, in the ultrasonic motor 8 which is an embodiment of the invention, the piezoelectric elements 82, 83 and 84 and the piezoelectric elements 85, 86 and 87 for a bending vibration having thicknesses that decrease as the distance from distortion-neutral plane increases are respectively stacked above and under the four piezoelectric elements 81 for a source of a longitudinal vibration. Therefore, the piezoelectric elements 82 through 87 increase the amount of the bending vibration of the ultrasonic motor 8 without interfering with the expansion and contraction of other piezoelectric elements. This increases the driving force of the ultrasonic motor 8, reduces the power consumption and improves the efficiency of the same.

Any modification may be made on the present embodiment as long as it does not depart from the principle of the invention.

For example, any piezoelectric material may be used for the piezoelectric elements 81 through 87.

The optimum ratio between the thicknesses of the piezoelectric elements 82 through 87 is not uniquely determined, and it is rather determined by a plurality of factors such as the electromechanical coupling coefficient of the piezoelectric material and the surface area of the stacking surfaces of the piezoelectric elements 82 through 87.

The polarizing structure of the piezoelectric elements 82 through 87 is not limited to the present embodiment, and any polarizing structure that generates a bending vibration may be used. For example, electrodes E may be provided between electrodes B, C and D as a common electrode with no insulating layer interposed therebetween. The applied electrical signals are not limited to have a phase of 90°, and they may be in the same phase.

The stacking structure and number of the piezoelectric elements 81 through 87 are not limited to those of the present embodiment as long as the thickness of a piezoelectric element is made smaller as the distance of the same from the distortion-neutral plane increases.

Figure 12:
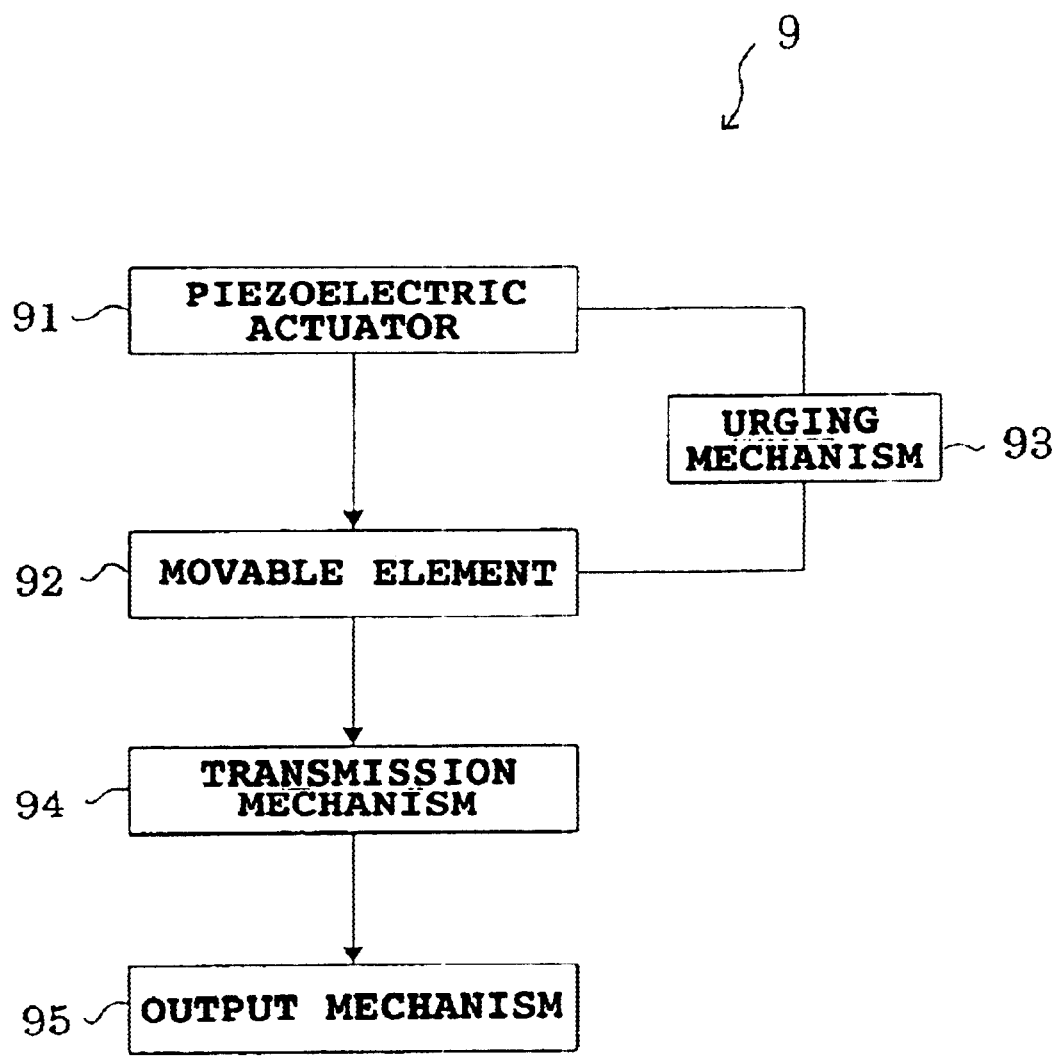
FIG. 12 is a block diagram illustrating a configuration of an electronic apparatus 9 with a piezoelectric actuator which is a seventh embodiment of the invention.
Figure 13A:
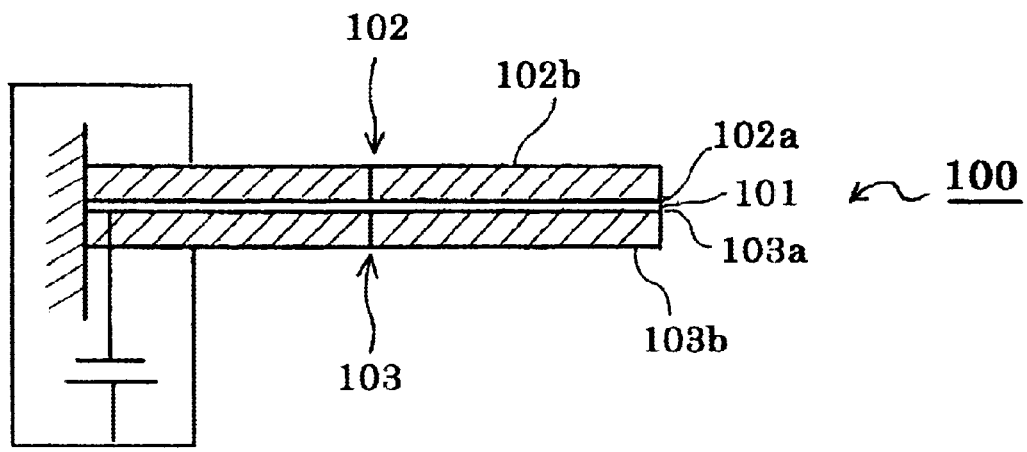
FIGS. 13A through 13C are schematic views illustrating a configuration and operation of a piezoelectric actuator 100 which is an example of a conventional piezoelectric actuator.
Figure 13B:
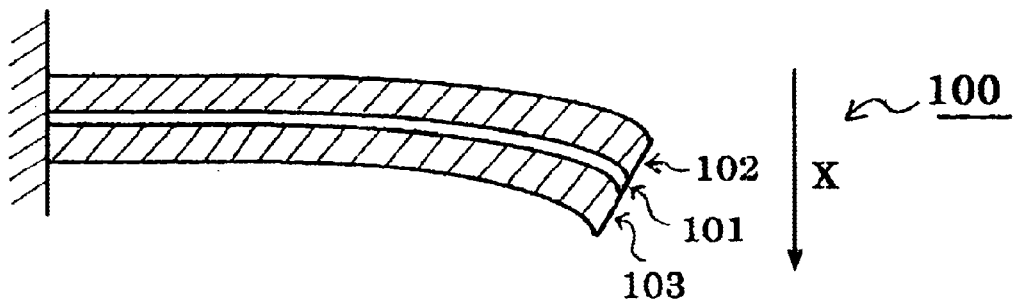
Figure 13C:
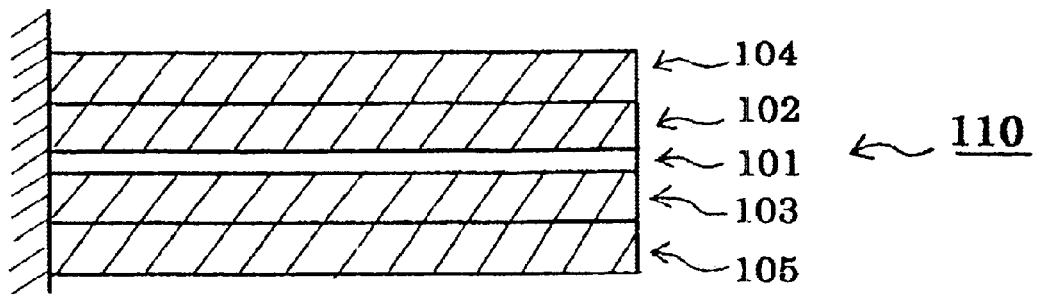

FIG. 12 is a block diagram showing a configuration of an electronic apparatus 9 with a piezoelectric actuator which is an application of a piezoelectric actuator according to the invention to an electronic apparatus.

The electronic apparatus 9 with a piezoelectric actuator is comprised of a piezoelectric actuator 91 having piezoelectric elements polarized in a predetermined manner, a movable element 92 moved by the piezoelectric actuator 91, an urging mechanism 93 for urging the piezoelectric element 91 and movable element 92, a transmission mechanism 94 which moves in cooperation with the movable element 92 and an output mechanism 95 moving in accordance with the operation of the transmission mechanism 94. For example, a spring is used as the urging mechanism 93.

The electronic apparatus 9 with a piezoelectric actuator includes, for example, an electronic clock, a measuring instrument, a camera, a printer, a machine tool, a robot, a transfer apparatus, a storage apparatus and the like.

For example, the piezoelectric actuator 91 is the piezoelectric actuator 1 or 2 or the ultrasonic motor 3, 4, 5, 6, 7, 7a or 8. For example, a transmission wheel such as a toothed wheel or frictional wheel is used as the transmission mechanism 94. For example, the output mechanism 95 is a shutter driving mechanism or a lens driving mechanism in a camera, a needle driving mechanism or calendar driving mechanism in an electronic clock, a head driving mechanism in a storage apparatus to drive a head for writing and reading information to and from a storage medium in the information storage apparatus, a blade feeding mechanism or a workpiece feeding mechanism in a machine tool, or the like.

The size and power consumption of the piezoelectric actuator of the electronic apparatus 9 can be small because it is a piezoelectric actuator according to the invention which provides greater output in comparison to that of conventional piezoelectric actuaters. Therefore, it can be made smaller than conventional electronic apparatuses with a piezoelectric actuator.

An ultrasonic motor alone serves as a driving mechanism when an output shaft is attached to the movable element 92 and a power transmission mechanism is provided to transmit torque from the output shaft.

What is claimed is:

1. A piezoelectric actuator comprising: a plurality of piezoelectric elements stacked in a first direction and in a second direction generally perpendicular to the first direction for undergoing expansion/contraction movement to vibrationally drive the piezoelectric elements in accordance with a driving signal applied thereto, the piezoelectric elements being stacked in the second direction without any spaces therebetween, and the length in the first direction of at least one of the piezoelectric elements being different from the length in the first direction of at least one other of the piezoelectric elements; and a plurality of electrodes disposed between the piezoelectric elements stacked in the first direction.

2. A piezoelectric actuator comprising: a plurality of groups of piezoelectric elements stacked in a stacking direction for undergoing expansion/contraction movement to vibrationally drive the piezoelectric elements in accordance with a driving signal applied thereto, each of the groups of piezoelectric elements extending in a longitudinal direction generally perpendicular to the stacking direction, and each piezoelectric element of at least one of the groups of piezoelectric elemets having a thickness extending in the stacking direction and a length different from the thickness thereof and extending in the longitudinal direction; wherein the plurality of groups of piezoelectric elements comprises a first group of piezoelectric elements, a second group of piezoelectric elements disposed on the first group of piezoelectric elements and defining the at least one of the groups of piezoelectric elements, a third group of piezoelectric elements disposed on the second group of piezoelectric elements, and a fourth group of piezoelectric elemetns disposed on the second group of piezoelectric elements.

3. A piezoelectric actuator according to claim 2; wherein the piezoelectric elements of the third and second groups of piezoelectric elements have the same thickness and length.

4. A piezoelectric actuator according to claim 3; wherein the piezoelectric elements of the first and second groups of piezoelectric elements have the same thickness and length.

5. A piezoelectric actuator according to claim 4; wherein the length of each piezoelectric element of the first and fourth groups of piezoelectric elements is one-half the length of each piezoelectric element of the second and third groups of piezoelectric elements.

6. A piezoelectric actuator according to claim 5; wherein each piezoelectric element of the second and third groups of piezoelectric elements is generally rectangular shaped.

7. A piezoelectric actuator according to claim 2; wherein each piezoelectric element of the first, second, third and fourth groups of piezoelectric elements is generally quadrilateral-shaped.

8. A piezoelectric actuator comprising: a cantilever body having a fixed end, a free end opposite the fixed end, a first pair of groups of identical piezoelectric elements, and a second pair of groups of identical piezoelectric elements disposed between the first pair of groups of identical piezoelectric elements, the first and second pairs of groups of identical piezoelectric elements being disposed between the fixed end and the free end for undergoing expansion/contraction movement to vibrationally drive the piezoelectric elements in accordance with a driving signal applied thereto, each of the piezoelectric elements of the first and second pairs of groups of identical piezoelectric elements having the same thickness in a stacking direction of the piezoelectric elements and a length extending in a direction generally perpendicular to the stacking direction, and the length of each piezoelectric element of the first pair of groups of identical piezoelectric elements being one-half the length of each piezoelectric element of the second pair of groups of identical piezoelectric elements.

\* \* \* \* \*